(12) United States Patent
Lakshmanan et al.

(10) Patent No.: US 12,538,804 B2
(45) Date of Patent: *Jan. 27, 2026

(54) INTEGRATED CIRCUIT PACKAGES TO MINIMIZE STRESS ON A SEMICONDUCTOR DIE

(71) Applicant: Analog Devices International Unlimited Company, Limerick (IE)

(72) Inventors: Ramji Sitaraman Lakshmanan, Limerick (IE); Bernard Stenson, Upper Manister (IE); Padraig Liam Fitzgerald, Mallow (IE); Oliver Kierse, Killaloe (IE); Michael James Twohig, County Cork (IE); Michael John Flynn, Waterford (IE); Laurence Brendan O'Sullivan, Limerick (IE)

(73) Assignee: Analog Devices International Unlimited Company, Limerick (IE)

( * ) Notice: Subject to any disclaimer, the term of this patent is extended or adjusted under 35 U.S.C. 154(b) by 0 days.

This patent is subject to a terminal disclaimer.

(21) Appl. No.: 18/670,309

(22) Filed: May 21, 2024

(65) Prior Publication Data
US 2024/0304569 A1    Sep. 12, 2024

Related U.S. Application Data

(63) Continuation of application No. 18/171,566, filed on Feb. 20, 2023, now Pat. No. 12,027,472, which is a
(Continued)

(51) Int. Cl.
*H01L 23/00* (2006.01)
*H01L 21/52* (2006.01)
(Continued)

(52) U.S. Cl.
CPC .......... *H01L 23/562* (2013.01); *H01L 21/52* (2013.01); *H01L 23/06* (2013.01); *H01L 23/20* (2013.01);
(Continued)

(58) Field of Classification Search
CPC ....... H01L 23/562; H01L 23/06; H01L 23/20; H01L 23/49811; H01L 23/49838;
(Continued)

(56) References Cited

U.S. PATENT DOCUMENTS 5,386,341 A    1/1995    Olson et al.
5,468,995 A    11/1995   Higgins, III
(Continued)

FOREIGN PATENT DOCUMENTS

DE    202005001559 U1    5/2005
DE    102007010711 A1    9/2008
TW    I779419 B          10/2022

OTHER PUBLICATIONS

"U.S. Appl. No. 16/951,720, Non Final Office Action mailed Jun. 8, 2022", 10 pgs.
(Continued)

*Primary Examiner* — Jasmine J Clark
(74) *Attorney, Agent, or Firm* — Schwegman Lundberg & Woessner, P.A.

(57) ABSTRACT

An integrated circuit package can contain a semiconductor die and provide electrical connections between the semiconductor die and additional electronic components. The integrated circuit package can reduce stress placed on the semiconductor die due to movement of the integrated circuit package due to, for example, temperature changes and/or moisture levels. The integrated circuit package can at least partially mechanically isolate the semiconductor die from the integrated circuit package.

20 Claims, 15 Drawing Sheets

Related U.S. Application Data continuation of application No. 16/951,720, filed on Nov. 18, 2020, now Pat. No. 11,616,027.

(60) Provisional application No. 62/949,145, filed on Dec. 17, 2019.

(51) Int. Cl.
*H01L 23/06* (2006.01)
*H01L 23/20* (2006.01)
*H01L 23/498* (2006.01)

(52) U.S. Cl.
CPC .. *H01L 23/49811* (2013.01); *H01L 23/49838* (2013.01); *H01L 24/16* (2013.01); *H01L 24/40* (2013.01); *H01L 24/48* (2013.01); *H01L 24/85* (2013.01); *H01L 2224/16225* (2013.01); *H01L 2224/40225* (2013.01); *H01L 2224/48225* (2013.01); *H01L 2224/85005* (2013.01)

(58) Field of Classification Search
CPC ......... H01L 21/52; H01L 24/16; H01L 24/40; H01L 24/48; H01L 24/85; H01L 24/81; H01L 24/83; H01L 2924/00014; H01L 2924/06; H01L 2224/16225; H01L 2224/40225; H01L 2224/85005; H01L 2224/245; H01L 2224/131; H01L 2224/04; H01L 2224/24; H01L 2224/056; H01L 2224/83871; H01L 2224/83868; H01L 2224/83862; H01L 2224/85801; H01L 2224/2919
USPC .......................................................... 257/682
See application file for complete search history.

(56) References Cited

U.S. PATENT DOCUMENTS

| | | |
|---|---|---|
| 5,703,405 A | 12/1997 | Zeber |
| 6,774,497 B1 | 8/2004 | Qi et al. |
| 7,808,087 B2 | 10/2010 | Zhao et al. |
| 7,821,117 B2 | 10/2010 | Brown et al. |
| 7,871,865 B2 | 1/2011 | Sengupta et al. |
| 8,664,752 B2 | 3/2014 | Jeon et al. |
| 9,343,367 B2 | 5/2016 | Goida et al. |
| 9,856,132 B2 | 1/2018 | Bryzek et al. |
| 11,616,027 B2 * | 3/2023 | Lakshmanan ........... H01L 24/40 257/682 |
| 2003/0209791 A1 | 11/2003 | Akram et al. |
| 2007/0200210 A1 | 8/2007 | Zhao et al. |
| 2008/0251866 A1 | 10/2008 | Belt et al. |
| 2009/0127697 A1 | 5/2009 | Pahl |
| 2010/0327421 A1 | 12/2010 | Luan |
| 2011/0121466 A1 | 5/2011 | Do et al. |
| 2016/0372441 A1 | 12/2016 | Kobayashi et al. |
| 2021/0183790 A1 | 6/2021 | Lakshmanan et al. |
| 2023/0207489 A1 | 6/2023 | Lakshmanan et al. |

OTHER PUBLICATIONS

"U.S. Appl. No. 16/951,720, Notice of Allowance mailed Nov. 18, 2022", 7 pgs.

"U.S. Appl. No. 16/951,720, Response filed Sep. 8, 2022 to Non Final Office Action mailed Jun. 8, 2022", 11 pgs.

"U.S. Appl. No. 18/171,566, Non Final Office Action mailed Jul. 7, 2023", 6 pgs.

"U.S. Appl. No. 18/171,566, Notice of Allowance mailed Feb. 21, 2024", 8 pgs.

"U.S. Appl. No. 18/171,566, Response filed Nov. 7, 2023 to Non Final Office Action mailed Jul. 7, 2023", 8 pgs.

"International Application Serial No. PCT/EP2020/086760, International Preliminary Report on Patentability mailed Jun. 30, 2022", 13 pgs.

"International Application Serial No. PCT/EP2020/086760, International Search Report mailed May 17, 2021", 7 pgs.

"International Application Serial No. PCT/EP2020/086760, Invitation to Pay Additional Fees mailed Mar. 23, 2021", 12 pgs.

"International Application Serial No. PCT/EP2020/086760, Written Opinion mailed May 17, 2021", 11 pgs.

"Taiwanese Application Serial No. 109144025, First Office Action mailed Nov. 24, 2021", w/ English translation, 19 pgs.

"Taiwanese Application Serial No. 109144025, Response filed Feb. 21, 2022 to First Office Action mailed Nov. 24, 2021", w/ English Claims, 71 pgs.

Hou, Zhenwei, "Integration of Thin Flip Chip in Liquid Crystal Polymer Based Flex", PhD. Dissertation at Auburn University, Auburn, AL, USA, (May 11, 2006), 111 pgs.

* cited by examiner

INTEGRATED CIRCUIT PACKAGES TO MINIMIZE STRESS ON A SEMICONDUCTOR DIE

CLAIM OF PRIORITY

This patent application is a continuation of U.S. patent application Ser. No. 18/171,566, filed Feb. 20, 2023, now U.S. Pat. No. 12,027,472, and entitled, "INTEGRATED CIRCUIT PACKAGES TO MINIMIZE STRESS ON A SEMICONDUCTOR DIE," which is a continuation of U.S. patent application Ser. No. 16/951,720, filed Nov. 18, 2020, U.S. Pat. No. 11,616,027, and entitled, "INTEGRATED CIRCUIT PACKAGES TO MINIMIZE STRESS ON A SEMICONDUCTOR DIE," which claims the benefit of priority from provisional U.S. patent application No. 62/949,145, filed Dec. 17, 2019, entitled, "INTEGRATED CIRCUIT PACKAGES TO MINIMIZE STRESS ON A SEMICONDUCTOR DIE," and naming Ramji Sitaraman Lakshmanan et al. as inventors, the disclosure of which are incorporated by reference herein, in their entirety.

FIELD OF THE DISCLOSURE

This document pertains generally, but not by way of limitation, to apparatuses and methods related to integrated circuit packages that reduce stress exerted by the integrated circuit packages on one or more semiconductor die contained within the integrated circuit packages.

BACKGROUND

Integrated circuit packages typically hold one or more integrated circuits that are formed on at least one semiconductor die. An integrated circuit package can be configured to provide protection for a semiconductor die contained within the integrated circuit package, while also providing connections to other electronic components of a device that use the one or more integrated circuits disposed on the semiconductor die. For example, an integrated circuit package can provide one or more electrical connections between one or more integrated circuits contained with the integrated circuit package and a printed circuit board coupled to the integrated circuit package. Integrated circuit packages often encase one or more semiconductor die and can be formed from a number of materials. To illustrate, an integrated circuit package can be formed from one or more polymeric materials, one or more ceramic materials, one or more metallic materials, one or more silicon (Si)-containing materials, or one or more combinations thereof. In various scenarios, an integrated circuit package can induce stress on one or more semiconductor die contained within the integrated circuit package that can have a detrimental impact on the performance of one or more integrated circuits disposed on a semiconductor die.

SUMMARY OF THE DISCLOSURE

An integrated circuit package can contain a semiconductor die and provide electrical connections between the semiconductor die and additional electronic components. The integrated circuit package can reduce stress placed on the semiconductor die due to movement of the integrated circuit package due to, for example, temperature changes and/or moisture levels. The integrated circuit package can at least partially mechanically isolate the semiconductor die from the integrated circuit package.

In one or more implementations, an integrated circuit (IC) package can carry a semiconductor IC die with reduced stress between the IC package and the semiconductor die. The IC package can include a base substrate having a mounting surface. The mounting surface can include a plurality of electrical contacts. In addition, the IC package can include a plurality of electrical connectors arranged to couple respective first electrical contacts of the plurality of electrical contacts on the mounting surface with corresponding second electrical contacts on the semiconductor die. The IC die can be suspended above a surface of the base substrate to form a suspension gap between a suspended surface of the IC die and the surface of the base substrate.

In one or more additional implementations, a process to produce an integrated circuit (IC) package that reduces stress between the IC package and a semiconductor die included in the IC package can include providing an IC package substrate including a mounting surface having a plurality of first electrical contacts and providing the semiconductor die. The semiconductor die can have a plurality of second electrical contacts disposed on a first surface of the semiconductor die. The process can also include coupling the mounting surface of the IC package substrate to a second surface of the semiconductor die using an attachment material. The second surface of the semiconductor die can face the mounting surface. In addition, the process can include coupling a plurality of electrical connectors between respective first electrical contacts of the plurality of first electrical contacts on the mounting surface and corresponding second electrical contacts of the plurality of second electrical contacts on the semiconductor die and removing the attachment material such that the IC die is suspended above the mounting surface to form a suspension gap between the second surface of the semiconductor die and the mounting surface.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various implementations discussed in the present document.

DETAILED DESCRIPTION

Figure 1:
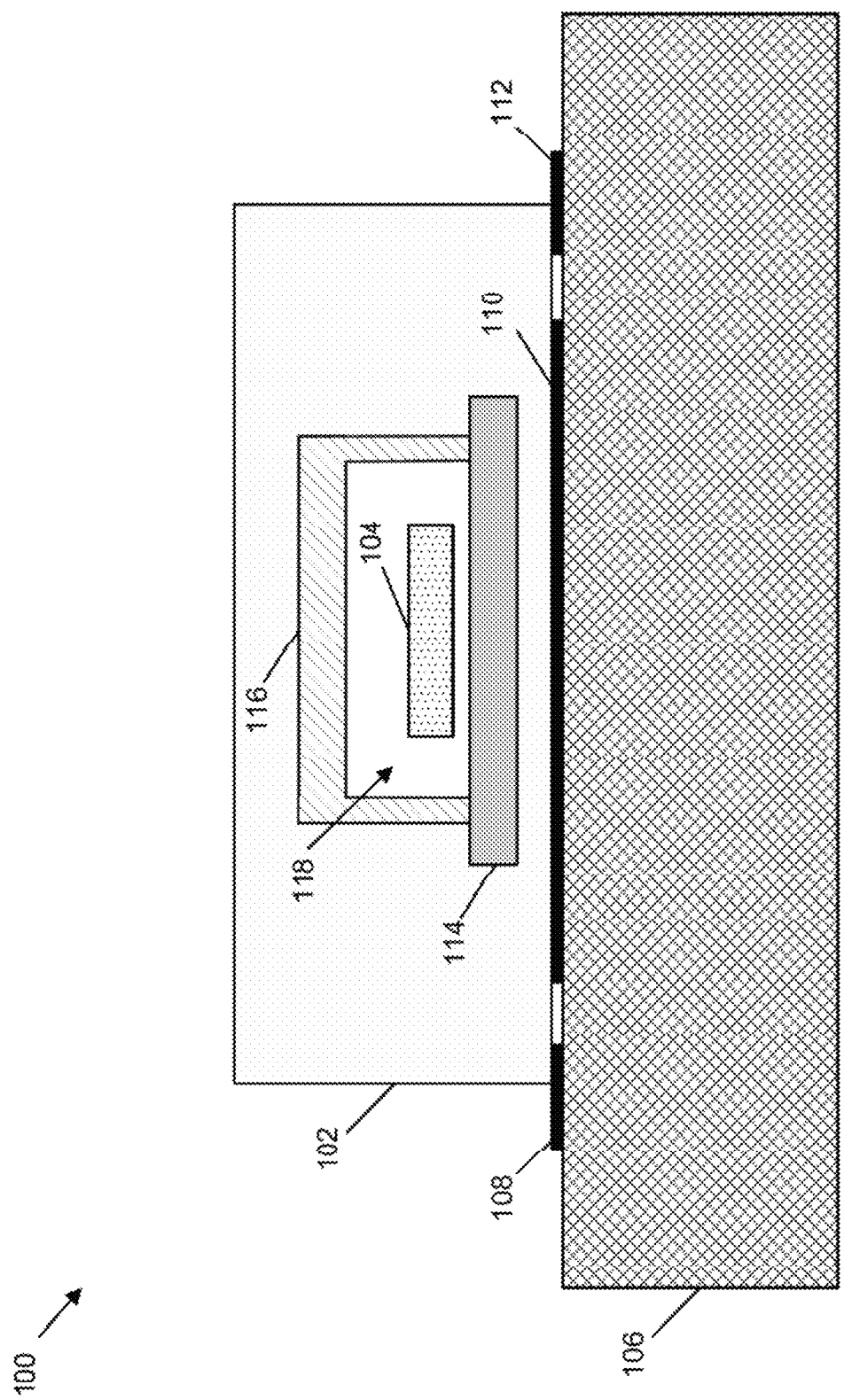
FIG. 1 is a diagram depicting a cross-section of at least a portion of an example electronic device that includes an integrated circuit package that has reduced stress effects on a semiconductor die contained within the integrated circuit package.

Integrated circuit packages often encase semiconductor die to provide protection of the semiconductor die from moisture, particulate (e.g., dust), and other potential contaminants. Integrated circuit packages are also configured to connect electronic components formed on semiconductor die to electronic components outside of the integrated circuit package. In various examples, an integrated circuit package can include a number of connectors to couple electronic components of a semiconductor die to a printed circuit board.

The integrated circuit packages that contain a semiconductor die can exert stresses on the semiconductor die and components disposed on the semiconductor die. Movement of the integrated circuit package can cause stress to be exerted on the semiconductor die within the integrated circuit package. In some situations, the movement of an integrated circuit package with respect to a semiconductor die can be due to differences in properties of materials used to form the integrated circuit packaging and materials of the semiconductor die. For example, one or more materials of an integrated circuit package can have a different coefficient of thermal expansion than one or more materials used to form the semiconductor die and/or components of the semiconductor die. In these scenarios, as the integrated circuit package and the semiconductor die are subjected to changing temperature conditions, differences between rates of expansion or contraction of the materials that form the integrated circuit package and the semiconductor die can cause stress to be placed on the semiconductor die by the integrated circuit package. Additionally, the stress exerted on the semiconductor die can be due to various points on the semiconductor die that are connected to the integrated circuit package. To illustrate, points where electrical connectors couple a semiconductor die to an integrated circuit package can cause stress to be exerted on the semiconductor die when the integrated circuit package moves.

In various situations, movement of a semiconductor die due to stresses exerted by an integrated circuit package can impact the performance of electronic components of the semiconductor die. For example, the operation of at least one of transistors, resistors, capacitors, or other electronic components can be impacted due to the movement of the semiconductor die on which the electronic components are disposed based on movement of the integrated circuit package that contains the semiconductor die. In illustrative examples, a reference voltage produced by a bandgap circuit can be impacted by movement of the semiconductor die on which the bandgap circuit is disposed. Additionally, parameters of amplifier circuits can also drift away from respective operating ranges in situations where the semiconductor die that includes the amplifier circuits moves as a result of stress exerted on the semiconductor die by the integrated circuit package that is holding the semiconductor die. As the parameters of electronic components of a semiconductor die are impacted by stresses placed on the semiconductor die by an integrated circuit package that contains the semiconductor die, the performance of electronic devices that operate using the electronic components disposed on the semiconductor die can be detrimentally impacted.

Implementations described herein are directed to integrated circuit packages that reduce the amount of stress exerted by the integrated circuit packages on semiconductor die contained within the integrated circuit packages. For example, integrated circuit packages described herein can increase the amount of mechanical isolation between a semiconductor die and the integrated circuit package that contains the semiconductor die by reducing the points of contact between the semiconductor die and the integrated circuit package. To illustrate, a semiconductor die can be suspended above a surface of an integrated circuit package such that the amount of surface area of the semiconductor die directly coupled to and/or in contact with the integrated circuit package is minimized. In some implementations, a semiconductor die can be suspended in a recessed region of an integrated circuit package substrate such that surfaces of the semiconductor die are not in contact with surfaces of the recessed region. Additionally, the connectors used to suspend the semiconductor die can have properties that minimize the amount of displacement of the suspended semiconductor die in response to movement of the integrated circuit package. In illustrative examples, connectors used to suspend a semiconductor die can have specified spring constant values to minimize the displacement of the semiconductor die based on movement by the integrated circuit package.

By minimizing the amount of contact between a semiconductor die and an integrated circuit package that holds the semiconductor die, the amount of stress exerted by the integrated circuit package on the semiconductor die is also minimized and improves the performance of electronic components of the semiconductor die. Further, configuring connectors used to suspend the semiconductor die to have properties that minimize the amount of movement of the semiconductor die in response to movement of the integrated circuit package can also decrease the amount of stress placed on the semiconductor die, resulting in improved performance and reliability of the electronic components on the semiconductor die.

In additional implementations described herein, one or more materials used to couple a semiconductor die to an integrated circuit package can have properties that decrease the amount of stress placed on the semiconductor die by the integrated circuit package. For example, the integrated circuit package can include one or more substrates that are formed from relatively flexible materials, such as polymeric materials, rather than conventional integrated circuit package substrates that are formed from relatively rigid materials, such as ceramics or glasses. The use of flexible substrates to couple a semiconductor die to an integrated circuit package can reduce the stress exerted on the on the semiconductor die by the integrated circuit package because the flexible substrates can absorb and/or better distribute some of the stress caused by movement of the integrated circuit package such that less stress is passed on to the semiconductor die in response to movement of the integrated circuit package.

Further, according to implementations described herein, a semiconductor die can be coupled to an integrated circuit package using adhesives that have a relatively low modulus of elasticity. In illustrative examples, one or more substrates used to couple a semiconductor die to an integrated circuit package can have a modulus of elasticity of no greater than about 3 gigapascals (GPa). The use of an adhesive to couple a semiconductor die to an integrated circuit package that is relatively flexible also aids in the absorption and/or distribution by the adhesive of stress caused by the movement of the integrated circuit package and decreases the amount of stress passed through to the semiconductor die.

Additionally, one or more substrates used to couple a semiconductor die to an integrated circuit package can have coefficients of thermal expansion that correspond to the coefficients of thermal expansion of the integrated circuit package. One or more substrates used to couple a semiconductor die to an integrated circuit package can also have coefficients of thermal expansion that correspond to coefficients of thermal expansion of the semiconductor die. In scenarios where the integrated circuit package and/or semiconductor die contain silicon, the coefficient(s) of thermal expansion of one or more substrates used to couple a semiconductor die to the integrated circuit package can correspond to the coefficient of thermal expansion of silicon. By utilizing one or more substrates to couple a semiconductor die to an integrated circuit package that has a coefficient of thermal expansion that corresponds to the coefficient of thermal expansion of the integrated circuit package and/or the semiconductor die, as the temperature that the integrated circuit package is exposed to changes, the amount of difference between the amount of expansion or contraction of the integrated circuit package and the one or more substrates used to couple the semiconductor die to the integrated circuit package is minimized. Accordingly, the stress exerted on the semiconductor die by the integrated circuit package is also minimized, which helps to improve the performance of circuitry on the semiconductor die.

FIG. 1 is a diagram depicting a cross-section of at least a portion of an example electronic device 100 that includes an integrated circuit package 102 that has reduced stress effects on a semiconductor die 104 contained within the integrated circuit package 102. The integrated circuit package 102 can be coupled to a substrate 106. In illustrative examples, the substrate 106 can include a printed circuit board. The integrated circuit package 102 can be coupled to the substrate 106 via one or more connectors, such as connectors 108, 110, 112. The connectors 108, 110, 112 can be metallic connectors that electrically couple electronic components of the integrated circuit package 102 with additional electronic components coupled to the substrate 106. In addition, although the illustrative example of FIG. 1 shows a single semiconductor die 104 included in the integrated circuit package 102, in additional implementations, the integrated circuit package 102 can include a plurality of semiconductor die that are coupled to the substrate 106 using a number of additional connectors.

The integrated circuit package 102 can include a base substrate 114 and a protective structure 116. The base substrate 114 and the protective structure 116 can, together, form a cavity 118 in which the semiconductor die 104 is housed. The base substrate 114 and the protective structure 116 can be composed of the same one or more materials. To illustrate, the base substrate 114 and the protective structure 116 can be composed of a Si-containing material. In implementations where the base substrate 114 and the protective structure 116 are composed of the same one or more materials, the base substrate 114 and the protective structure 116 can be a uniform piece of material. The base substrate 114 and the protective structure 116 can also be separate components and joined using one or more bonding materials. In illustrative examples where the base substrate 114 and the protective structure 116 are composed of different materials, the base substrate 114 can include a polymeric material and the protective structure 116 can include a metallic material. In various examples, the base substrate 114 and the protective structure 116 can be encased by a polymeric material. Additionally, the cavity 118 can be filled with a material. For example, the cavity 118 can be filled with at least one of a gas, a polymeric material, an oil, a gel, or a dielectric material. In various examples, the cavity 118 can be filled with air. In additional examples, the cavity 118 can be filled with a relatively dense gas having a density that is at least 2 times the density of air at 20° C. and 1 atmosphere (atm), at least 3 times the density of air at 20° C. and 1 atm, or at least 4 times the density of air at 20° C. and 1 atm. The cavity 118 can, in some implementations, be filled with sulfur hexafluoride ($SF_6$). The cavity 118 can also be filled with a fluorine-containing oil.

The semiconductor die 104 can be composed of one or more semiconducting materials. To illustrate, the semiconductor die 104 can be composed of silicon, germanium, a silicon carbide (SiC), a gallium nitride (GaN), a gallium arsenide (GaAs), or one or more combinations thereof. The semiconductor die 104 can also include one or more regions that include dopants. For example, one or more doped regions of the semiconductor die 104 can include an n-type dopant, such as phosphorus and/or arsenic. In additional examples, the one or more doped regions of the semiconductor die 104 can include a p-type dopant, such as boron or gallium. The semiconductor die 104 can be a foundation on which one or more electrical features are formed. For example, one or more integrated circuits can be formed on and/or within the semiconductor die 104. The one or more integrated circuits can include at least one of one or more transistors, one or more capacitors, one or more resistors, one or more inductors, one or more connectors, or one or more additional electronic components. In illustrative examples, at least one of amplifier circuitry or bandgap reference voltage circuitry can be disposed on the semiconductor die 104.

The amount of stress exerted by the integrated circuit package 102, including the base substrate 114 and/or the protective structure 116, on the semiconductor die 104 can be minimized by mechanically isolating the semiconductor die 104 from parts of the integrated circuit package 102. The semiconductor die 104 can be mechanically isolated from the integrated circuit package 102 by minimizing the amount of contact between the semiconductor die 104 and the integrated circuit package 102. For example, the semiconductor die 104 can be suspended above a surface of the integrated circuit package 102 such that the semiconductor die 104 is coupled to the integrated circuit package 102 by one or more connectors. Additionally, the semiconductor die 104 can be mechanically isolated from the integrated circuit package 102 by minimizing the displacement of the semiconductor die 104 in response to movement of the integrated circuit package 102. To illustrate, the semiconductor die 104 can be coupled to the integrated circuit package 102 using one or more connectors that have specified spring constants that results in less movement of the semiconductor die 104 in relation to the amount of movement of the integrated circuit package 102.

Further, the semiconductor die 104 can be mechanically isolated from the integrated circuit package 102 by coupling the semiconductor die 104 to the integrated circuit package 102 using relatively flexible bonding materials. In illustrative examples, the semiconductor die 104 can be coupled to a surface of the integrated circuit package 102 using one or more adhesives that have a relatively low modulus of elasticity. For example, the semiconductor die 104 can be coupled to at least one surface of the integrated circuit package 102 using one or more adhesives having a modulus of elasticity that is no greater than about 3 GPA, no greater than about 2.5 GPa, no greater than about 2 GPa, no greater than about 1.5 GPa, or no greater than about 1 GPa. To illustrate, the semiconductor die 104 can be coupled to at least one surface of the integrated circuit package 102 using one or more adhesives having a modulus of elasticity from about 0.1 GPa to about 3 GPa, from about 0.2 GPa, to about 2 GPa, or from about 0.3 GPa to about 0.8 GPa.

In addition, the integrated circuit package 102 can include one or more relatively flexible support substrates to couple the semiconductor die 104 to the integrated circuit package 102. In various examples, the base substrate 114 can be a support substrate that couples the semiconductor die 104 to the integrated circuit package 102 in addition to other substrates disposed between the base substrate 114 and the printed circuit board 106. The one or more support substrates can include laminates having a number of layers comprised of various materials. To illustrate, the one or more support substrates can be comprised of at least one of one or more polymeric materials, one or more metallic materials, one or more glass materials, or one or more ceramic materials. In illustrative examples, the one or more support substrates can include a polyimide. In additional illustrative examples, the one or more support substrates can include a flame retardant 4 (FR4) material. The one or more support substrates can also include an FR5 material.

Further, the one or more support substrates used to couple the semiconductor die 104 to the integrated circuit package 102 can have a coefficient of thermal expansion that corresponds to a coefficient of thermal expansion of the integrated circuit package 102 and/or to a coefficient of thermal expansion of the semiconductor die 104. For example, the one or more support substrates can have a coefficient of thermal expansion that is within about 30% of a coefficient of thermal expansion of the integrated circuit package 102, about 25% of a coefficient of thermal expansion of the integrated circuit package 102, about 20% of a coefficient of thermal expansion of the integrated circuit package 102, about 15% of a coefficient of thermal expansion of the integrated circuit package 102, about 10% of a coefficient of thermal expansion of the integrated circuit package 102, or about 5% of a coefficient of thermal expansion of the integrated circuit package 102. Additionally, the one or more support substrates can have a coefficient of thermal expansion that is within about 30% of a coefficient of thermal expansion of the semiconductor die 104, about 25% of a coefficient of thermal expansion of the semiconductor die 104, about 20% of a coefficient of thermal expansion of the semiconductor die 104, about 15% of a coefficient of thermal expansion of the semiconductor die 104, about 10% of a coefficient of thermal expansion of the semiconductor die 104, or about 5% of a coefficient of thermal expansion of the semiconductor die 104. In scenarios where the integrated circuit package 102 and/or the semiconductor die 104 includes Si, the one or more support substrates coupling the semiconductor die 104 to the integrated circuit package 102 can have a coefficient of thermal expansion that corresponds to the coefficient of thermal expansion of Si.

Figure 2:
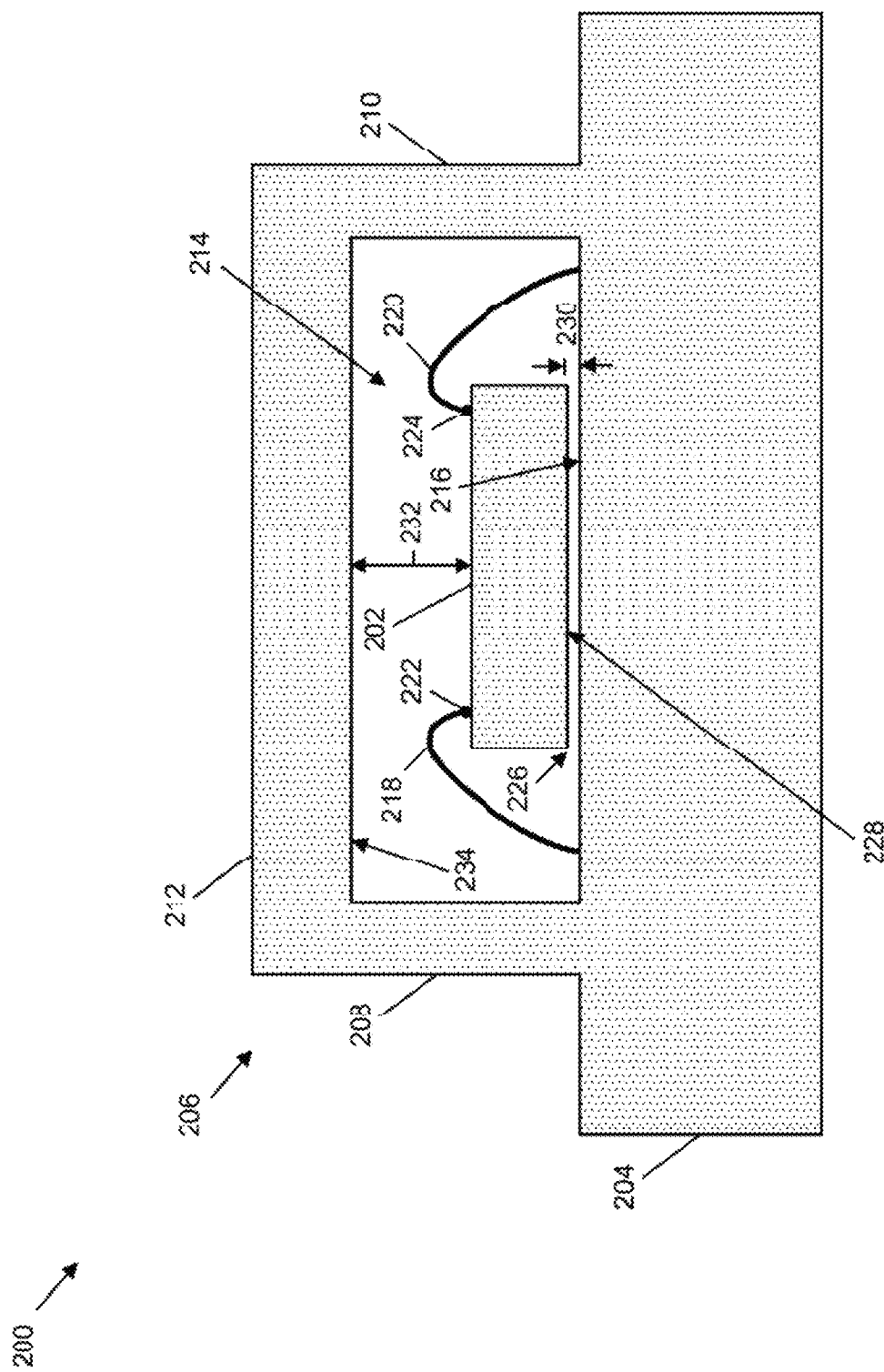
FIG. 2 is a diagram depicting a cross-section of at least a portion of an example integrated circuit package that suspends a semiconductor die above a surface of the integrated circuit package using wire supports.

FIG. 2 is a diagram depicting a cross-section of at least a portion of an example integrated circuit package 200 that suspends a semiconductor die 202 above a surface of the integrated circuit package 200 using wire supports. The semiconductor die 202 can include circuitry that is configured to perform one or more functions. In various examples, the semiconductor die 202 can include one or more electronic components, such as transistors, capacitors, resistors, inductors, one or more combinations thereof, and the like. In illustrative examples, one or more integrated circuits can be disposed on and/or within the semiconductor die 202. In illustrative examples, the integrated circuit package 200 can comprise at least a portion of the integrated circuit package 102 of FIG. 1.

The integrated circuit package 200 can include a base substrate 204 and a protective structure 206. The protective structure 206 can include a first side member 208 and a second side member 210. The first side member 208 and the second side member 210 can be disposed at least substantially parallel with respect to each other. The protective structure 206 can also include a top member 212 that is disposed at least substantially perpendicular with respect to the first side member 208 and the second side member 210. In illustrative examples, the first side member 208, the second side member 210, and the top member 212 can be a continuous piece of material. In additional illustrative examples, the base substrate 204 and the protective structure 206 can be a continuous piece of material. In various implementations, the base substrate 204 and the protective structure 206 can be comprised of Si. In implementations where the base substrate 204 and the protective structure 206 are separate components, the base substrate 204 can be coupled to the protective structure 206 using one or more bonding materials. Further, the base substrate 204 can have a thickness from about 100 micrometers to about 800 micrometers, from about 150 micrometers to about 500 micrometers, from about 400 micrometers to about 800 micrometers, from about 200 micrometers to about 400 micrometers, or from about 100 micrometers to about 200 micrometers.

The base substrate 204 and the protective structure 206 can form a cavity 214 in which the semiconductor die 202 is located. The cavity 214 can be filled with a material. For example, the cavity 214 can be filled with air. Additionally, the cavity 214 can be filled with a gas that has a greater density value than air at 20° C. and 1 atm. To illustrate, the cavity 214 can be filled with $SF_6$. Further, the cavity 214 can be filled with a polymeric material or a dielectric material. The cavity 214 can also be filled with an oil. In various examples, the cavity 214 can be filled with a gel.

The semiconductor die 202 can be coupled to a mounting surface 216 of the base substrate 204 using a plurality of wire connectors that can include at least a first wire connector 218 and a second wire connector 220. The first wire connector 218 and the second wire connector 220 can be composed of a metallic material. For example, the first wire connector 218 and the second wire connector 220 can be comprised of at least one of copper, an alloy of copper, aluminum, an alloy of aluminum, gold, an alloy of gold, nickel, an alloy of nickel, titanium, an alloy of titanium, lead, an alloy of lead, tin, an alloy of tin, or one or more combinations thereof. The first wire connector 218 and the second wire connector 220 can have a diameter from about 0.1 micrometers to about 10 micrometers or from about 0.5 micrometers to about 5 micrometers. Additionally, the first wire connector 218 and the second wire connector 220 can have a length from about 50 micrometers to about 500 micrometers, from about 100 micrometers to about 400 micrometers, from about 200 micrometers to about 400 micrometers, or from about 250 micrometers to about 500 micrometers.

The first wire connector 218 can be coupled to the semiconductor die 202 using a first ball connector 222 and the second wire connector 220 can be coupled to the semiconductor die 202 using a second ball connector 224. The first ball connector 222 and the second ball connector 224 can be comprised of a metallic material. In illustrative examples, the first ball connector 222 and the second ball connector 224 can be comprised of solder. Although not shown in the illustrative example of FIG. 2, the first ball connector 222 and the second ball connector 224 can be coupled to respective electrical contacts, such as bond pads, disposed on the surface of the semiconductor die 202. In implementations herein, the surface of the semiconductor die 202 on which the electrical connectors, ball connectors, and/or electrical contacts are disposed can be referred to as a contacts surface.

Although not shown in the illustrative example of FIG. 2, a number of electrical connectors, such as bond pads, can be disposed on the mounting surface 216 of the base substrate 204. The bond pads disposed on the mounting surface 216 can be comprised of metallic materials. At least a portion of the bond pads disposed on the mounting surface 216 can couple the first wire connector 218 and the second wire connector 220 to the mounting surface 216. In illustrative examples, a plurality of bond pads can be disposed on the mounting surface 216 and the first wire connector 218 can be coupled to a first bond pad on the mounting surface 216 and the second wire connector 220 can be coupled to a second bond pad on the surface 218.

In various examples, the first wire connector 218 and the second wire connector 220 can be mechanically and electrically coupled to one or more electronic components via the base substrate 204. That is, electrical signals can be communicated between one or more electronic components of the semiconductor die 202 and one or more electronic components disposed on or electrically coupled to the base substrate 204 using the first wire connector 216 and the second wire connector 218. In additional examples, the first wire connector 216 and the second wire connector 218 can be used to mechanically couple the semiconductor die 202 to the mounting surface 216 of the base substrate 204 without providing electrical connections between one or more electronic components of the semiconductor die 202 and one or more electronic components that are electrically coupled to the base substrate 204. In these situations, additional connectors (not shown in FIG. 2) can be used to electrically couple one or more electronic components of the semiconductor die 202 to one or more additional electronic components electrically coupled to the base substrate 204. In illustrative examples, traces disposed on and/or within the base substrate 204 that are interior with respect to the protective structure 206 can follow a path under the first side member 208 and the second side member 210 to route electrical signals under the first side member 208 and the second side member 210 to electronic components outside of the protective structure 206.

The first wire connector 218 and the second wire connector 220 can couple the semiconductor die 202 to the base substrate 204 such that the semiconductor die 202 is suspended above the mounting surface 216 and a suspension gap 226 is formed between the mounting surface 216 of the base substrate 204 and a suspended surface 228 of the semiconductor die 202. The suspended surface 228 can be at least substantially parallel with respect to the mounting surface 216. The suspension gap 226 can be free of material other than one or more materials that fill the cavity 214. That is, the suspension gap 226 can be free of adhesives and connectors coupling the semiconductor die 202 to the base substrate 204. For example, the suspension gap 226 can be free of material with the exception of a gas. To illustrate, the suspension gap 226 can be free of material with the exception of air or $SF_6$. In illustrative examples, the suspension gap 226 can be free of material with the exception of an oil.

The suspension gap 226 can have a height 230 that is no greater than about 50 micrometers, no greater than about 45 micrometers, no greater than about 40 micrometers, no greater than about 35 micrometers, no greater than about 30 micrometers, or no greater than about 25 micrometers. Additionally, the suspension gap 226 can have a height 230 that is at least about 1 micrometer, at least about 5 micrometers, at least about 10 micrometers, at least about 15 micrometers, or at least about 20 micrometers. In illustrative examples, the suspension gap 226 can have a height 230 from about 1 micrometer to about 50 micrometers, from about 5 micrometers to about 40 micrometers, or from about 10 micrometers to about 30 micrometers.

An additional gap 232 can also be included in the cavity 214 between the semiconductor die 202 and an inner surface 234 of the top member 212. The additional gap 232 can be from about 20 micrometers to about 100 micrometers, from about 30 micrometers to about 90 micrometers, from about 40 micrometers to about 80 micrometers, from about 30 micrometers to about 70 micrometers, or from about 40 micrometers to about 100 micrometers. Further, the semiconductor die 202 can have a thickness from about 30 micrometers to about 120 micrometers, from about 40 micrometers to about 100 micrometers, or from about 50 micrometers to about 90 micrometers. In illustrative examples, a height of the cavity 214 from the mounting surface 216 to the surface 234 can be from about 50 micrometers to about 200 micrometers, from about 75 micrometers to about 180 micrometers, or from about 110 micrometers to about 170 micrometers.

The first wire connector 218 and the second wire connector 220 can be configured to minimize displacement of the semiconductor die 202 in response to movement of the integrated circuit package 200. The first wire connector 218 and the second wire connector 220 can have spring constants that enable the semiconductor die 202 to be suspended above the base substrate 204 and to limit the displacement of the semiconductor die 202 in response to movement of the integrated circuit package 200.

In illustrative examples, the first wire connector 218 and the second wire connector 220 can couple the semiconductor die 202 to the integrated circuit package 200 such that when a force up to about 50,000 gravitational force equivalents (g's) is applied to one or more portions of the semiconductor die 202, the displacement of the semiconductor die 202 is no greater than about 3 micrometers. In additional examples, the first wire connector 218 and the second wire connector 220 can couple the semiconductor die 202 to the integrated circuit package 200 such that when a force up to 40,000 g's is applied to one or more portions of the semiconductor die 202, the displacement of the semiconductor die 202 is no greater than about 2 micrometers. In further examples, the first wire connector 218 and the second wire connector 220 can couple the semiconductor die 202 to the integrated circuit package 200 such that when a force up to 40,000 g's is applied to one or more portions of the semiconductor die 202, the displacement of the semiconductor die 202 is no greater than about 1 micrometer. The first wire connector 218 and the second wire connector 220 can also couple the semiconductor die 202 to the integrated circuit package 200 such that when a force up to 30,000 g's is applied to one or more portions of the semiconductor die 202, the displacement of the semiconductor die 202 is no greater than about 1 micrometer.

The number of wire connectors, including the first wire connector 218 and the second wire connector 220, coupling the semiconductor die 202 to the base substrate 204 can also be a factor in the amount of displacement of the semiconductor die 202 in response to movement of the integrated circuit package 200. In illustrative examples, from about 6 wire connectors to about 50 wire connectors can couple the semiconductor die 202 to the base substrate 204. In additional examples, from about 6 wire connectors to about 14 wire connectors can couple the semiconductor die 202 to the base substrate 204. In further examples, from about 36 wire connectors to about 50 wire connectors can couple the semiconductor die 202 to the base substrate 204. Additionally, in scenarios where from about 36 wire connectors to about 50 wire connectors couple the semiconductor die 202 to the base substrate 204, the displacement of the semiconductor die 202 when from about 25,000 g's to about 35,000 g's is applied to one or more portions of the semiconductor die 202 can be from about 0.5 micrometers to about 1.5 micrometers.

Figure 3:
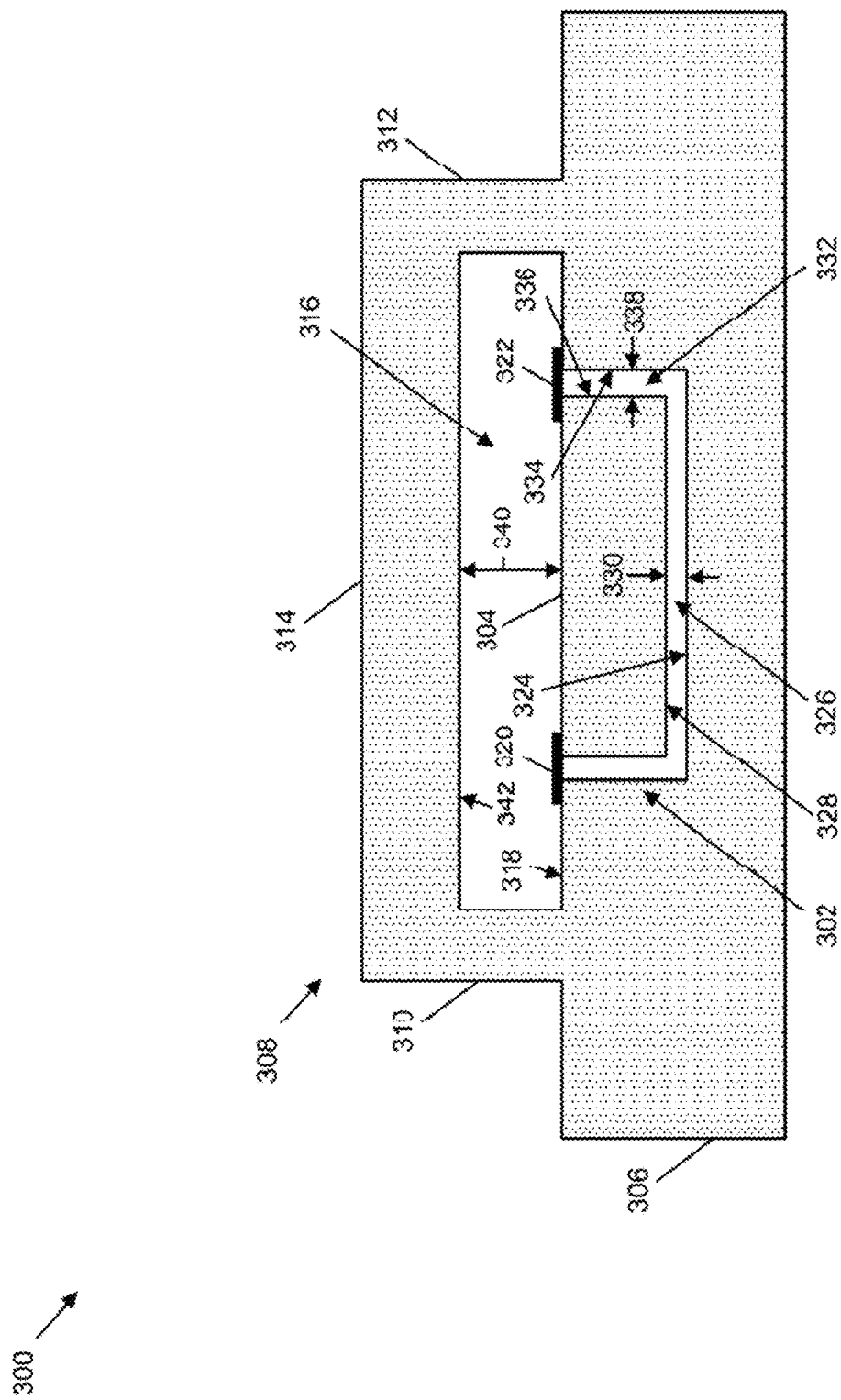
FIG. 3 is a diagram depicting a cross-section of at least a portion of an example integrated circuit package that includes a recessed region with a semiconductor die disposed in the recessed region and suspended above a surface of the recessed region using tether supports.

FIG. 3 is a diagram depicting a cross-section of at least a portion of an example integrated circuit package 300 that includes a recessed region 302 with a semiconductor die 304 disposed in the recessed region 302 and suspended above a surface of the recessed region 302 using tether supports. The semiconductor die 304 can include circuitry that is configured to perform one or more functions. In various examples, the semiconductor die 304 can include one or more electronic components, such as transistors, capacitors, resistors, inductors, one or more combinations thereof, and the like. In illustrative examples, one or more integrated circuits can be disposed on and/or within the semiconductor die 304. In illustrative examples, the integrated circuit package 300 can comprise at least a portion of the integrated circuit package 102 of FIG. 1.

The integrated circuit package 300 can include a base substrate 306 and a protective structure 308. The protective structure 308 can include a first side member 310 and a second side member 312. The first side member 310 and the second side member 312 can be disposed at least substantially parallel with respect to each other. The protective structure 308 can also include a top member 314 that is disposed at least substantially perpendicular with respect to the first side member 310 and the second side member 312. In illustrative examples, the first side member 310, the second side member 312, and the top member 314 can be a continuous piece of material. In additional illustrative examples, the base substrate 306 and the protective structure 308 can be a continuous piece of material. In various implementations, the base substrate 306 and the protective structure 308 can be comprised of Si. In implementations where the base substrate 306 and the protective structure 308 are separate components, the base substrate 306 can be coupled to the protective structure 308 using one or more bonding materials. Further, the base substrate 306 can have a thickness from about 100 micrometers to about 800 micrometers, from about 150 micrometers to about 500 micrometers, from about 400 micrometers to about 800 micrometers, from about 200 micrometers to about 400 micrometers, or from about 100 micrometers to about 200 micrometers.

The base substrate 306 and the protective structure 308 can form a cavity 316. The cavity 316 can be filled with a material. For example, the cavity 316 can be filled with air. Additionally, the cavity 316 can be filled with a gas that has a greater density value than air at 20° C. and 1 atm. To illustrate, the cavity 316 can be filled with $SF_6$. Further, the cavity 316 can be filled with a polymeric material or a dielectric material. The cavity 316 can also be filled with an oil. In various examples, the cavity 316 can be filled with a gel.

The semiconductor die 304 can be coupled to a mounting surface 318 of the base substrate 306 using a number of tethers that includes at least a first tether 320 and a second tether 322. The first tether 320 and the second tether 322 can be composed of a metallic material. For example, the first tether 320 and the second tether 322 can be comprised of at least one of copper, an alloy of copper, aluminum, an alloy of aluminum, gold, an alloy of gold, nickel, an alloy of nickel, titanium, an alloy of titanium, lead, an alloy of lead, tin, an alloy of tin, or one or more combinations thereof. The first tether 320 and the second tether 322 can also be comprised of a polymeric material. Additionally, the first tether 320 and the second tether 322 can be comprised of a dielectric material. The first tether 320 and the second tether 322 can have a thickness from about 2 micrometers to about 10 micrometers, from about 5 micrometers to about 10 micrometers, or from about 4 micrometers to about 8 micrometers.

Although not shown in the illustrative example of FIG. 3, a number of bond pads can be disposed on the mounting surface 318 of the base substrate 306. The bond pads disposed on the mounting surface 318 can be comprised of metallic materials. At least a portion of the bond pads disposed on the mounting surface 318 can couple the first tether 320 and the second tether 322 to the mounting surface 318. In illustrative examples, a plurality of bond pads can be disposed on the mounting surface 318 and the first tether 320 can be coupled to a first bond pad on the mounting surface 318 and the second tether 322 can be coupled to a second bond pad on the mounting surface 318. Additionally, the first tether 320 and the second tether 322 can be coupled to respective electrical contacts, such as bond pads, disposed on a surface of the semiconductor die 304. In implementations herein, the surface of the semiconductor die 304 on which the tethers 320, 322 and the electrical contacts are disposed can be referred to as a contacts surface.

In additional implementations not shown in FIG. 3, at least a portion of the first tether 320 and the second tether 322 can be encased by a layer of polymeric material that is disposed around at least a portion of a perimeter of the semiconductor die 304 and along one or more edges of the recessed region 302. For example, a layer of negative photoresist can be disposed around portions of edges of the semiconductor die 304 and edges of the recessed region 302 and the first tether 320 and the second tether 322 can be disposed on and/or within the layer of negative photoresist.

In various examples, the first tether 320 and the second tether 322 can be mechanically and electrically coupled to one or more electronic components via the base substrate 306. That is, electrical signals can be communicated between one or more electronic components of the semiconductor die 304 and one or more electronic components disposed on or electrically coupled to the base substrate 306 using the first tether 320 and the second tether 322. In additional examples, the first tether 318 and the second tether 320 can be used to mechanically couple the semiconductor die 304 to the mounting surface 318 of the base substrate 306 without providing electrical connections between one or more electronic components of the semiconductor die 304 to one or more electronic components that are electrically coupled to the base substrate 306. In these situations, additional connectors (not shown in FIG. 3) can be used to electrically couple one or more electronic components of the semiconductor die 304 to one or more additional electronic components electrically coupled to the base substrate 306. In illustrative examples, traces disposed on and/or within the base substrate 306 that are interior with respect to the protective structure 308 can follow a path under the first side member 310 and the second side member 312 to route electrical signals under the first side member 310 and the second side member 312 to electronic components outside of the protective structure 308.

The first tether 320 and the second tether 322 can couple the semiconductor die 304 to the base substrate 306 such that at least a portion of the semiconductor die 304 is disposed within the recessed region 302 and is suspended above a recessed surface 324 within the recessed region 302. In this way, a suspension gap 326 is formed between the recessed surface 324 within the recessed region 302 of the base substrate 306 and a suspended surface 328 of the semiconductor die 304. The suspended surface 328 can be at least substantially parallel with respect to the recessed surface 324. The suspension gap 326 can be free of material other than one or more materials that fill the cavity 316 and/or the recessed region 302. That is, the suspension gap 326 can be free of adhesives and connectors coupling the semiconductor die 304 to the base substrate 306. For example, the suspension gap 326 can be free of material with the exception of a gas. To illustrate, the suspension gap 326 can be free of material with the exception of air or $SF_6$. In illustrative examples, the suspension gap 326 can be free of material with the exception of an oil that at least partially fills the cavity 316 and the recessed region 302. In additional examples, a first material that fills the cavity 316 can be different from a second material that fills the recessed region 302 including the suspension gap 326. In various examples, the cavity 316 can be filled with a gas and the portions of the recessed region 302 not occupied by the semiconductor die 304 can be occupied by an oil or a gel.

The suspension gap 326 can have a height 330 that is no greater than about 50 micrometers, no greater than about 45 micrometers, no greater than about 40 micrometers, no greater than about 35 micrometers, no greater than about 30 micrometers, or no greater than about 25 micrometers. Additionally, the suspension gap 326 can have a height 330 that is at least about 1 micrometer, at least about 5 micrometers, at least about 10 micrometers, at least about 15 micrometers, or at least about 20 micrometers. In illustrative examples, the suspension gap 326 can have a height 330 from about 1 micrometer to about 50 micrometers, from about 5 micrometers to about 40 micrometers, or from about 10 micrometers to about 30 micrometers.

Gaps can also be present within the cavity 302 and on a side of the semiconductor die 304. For example, a gap 332 can be present between a sidewall surface 334 of the recessed region 302 and a side 336 of the semiconductor die 304. In various implementations, the sidewall surface 334 can be part of a sidewall surface of the recessed region 302. Although not expressly indicated in the illustrative example of FIG. 3, a gap can also be present on the other side of the semiconductor die 304 within the recessed region 302. The gap 332 can have a width 338 that is a same size as the height 330 of the suspension gap 326. In additional implementations, the gap 332 can have a width 338 that is different from the height 330 of the suspension gap 332. In illustrative examples, the width 338 of the gap 332 can be no greater than about 50 micrometers, no greater than about 45 micrometers, no greater than about 40 micrometers, no greater than about 35 micrometers, no greater than about 30 micrometers, or no greater than about 25 micrometers. Additionally, the gap 332 can have a width 338 that is at least about 1 micrometer, at least about 5 micrometers, at least about 10 micrometers, at least about 15 micrometers, or at least about 20 micrometers. Further, the gap 332 can have a width 338 from about 1 micrometer to about 50 micrometers, from about 5 micrometers to about 40 micrometers, or from about 10 micrometers to about 30 micrometers. A height 340 of the cavity 316 from the mounting surface 318 of the base substrate 318 to an inner surface 342 of the top portion 314 can be from about 50 micrometers to about 200 micrometers, from about 75 micrometers to about 180 micrometers, or from about 110 micrometers to about 170 micrometers.

Further, the semiconductor die 304 can have a thickness from about 30 micrometers to about 120 micrometers, from about 40 micrometers to about 100 micrometers, or from about 50 micrometers to about 90 micrometers. In illustrative examples, a height of the cavity 316 from the mounting surface 318 to the surface 342 can be from about 50 micrometers to about 200 micrometers, from about 75 micrometers to about 180 micrometers, or from about 110 micrometers to about 170 micrometers.

The first tether 320 and the second tether 322 can be configured to minimize displacement of the semiconductor die 304 in response to movement of the integrated circuit package 300. That is, the length, thickness, material(s), and/or physical properties of the first tether 320 and the second tether 322 can be configured to minimize displacement of the semiconductor die 304 in response to movement of the integrated circuit package 300. Additionally, a number of the tethers coupling the semiconductor die 304 to the base substrate 306 can be configured to minimize displacement of the semiconductor die 304 in response to movement of the integrated circuit package 300.

In illustrative examples, the first tether 320 and the second tether 322 can couple the semiconductor die 304 to the integrated circuit package 300 such that when a force up to about 50,000 g's is applied to one or more portions of the semiconductor die 304, the displacement of the semiconductor die 304 is no greater than about 3 micrometers. In additional examples, the first tether 320 and the second tether 322 can couple the semiconductor die 304 to the integrated circuit package 300 such that when a force up to 40,000 g's is applied to one or more portions of the semiconductor die 304, the displacement of the semiconductor die 304 is no greater than about 2 micrometers. In further examples, the first tether 320 and the second tether 322 can couple the semiconductor die 304 to the integrated circuit package 300 such that when a force up to 40,000 g's is applied to one or more portions of the semiconductor die 304, the displacement of the semiconductor die 304 is no greater than about 1 micrometer. The first tether 320 and the second tether 322 can couple the semiconductor die 304 to the integrated circuit package 300 such that when a force up to 30,000 g's is applied to one or more portions of the semiconductor die 304, the displacement of the semiconductor die 304 is no greater than about 1 micrometer.

Figure 4:
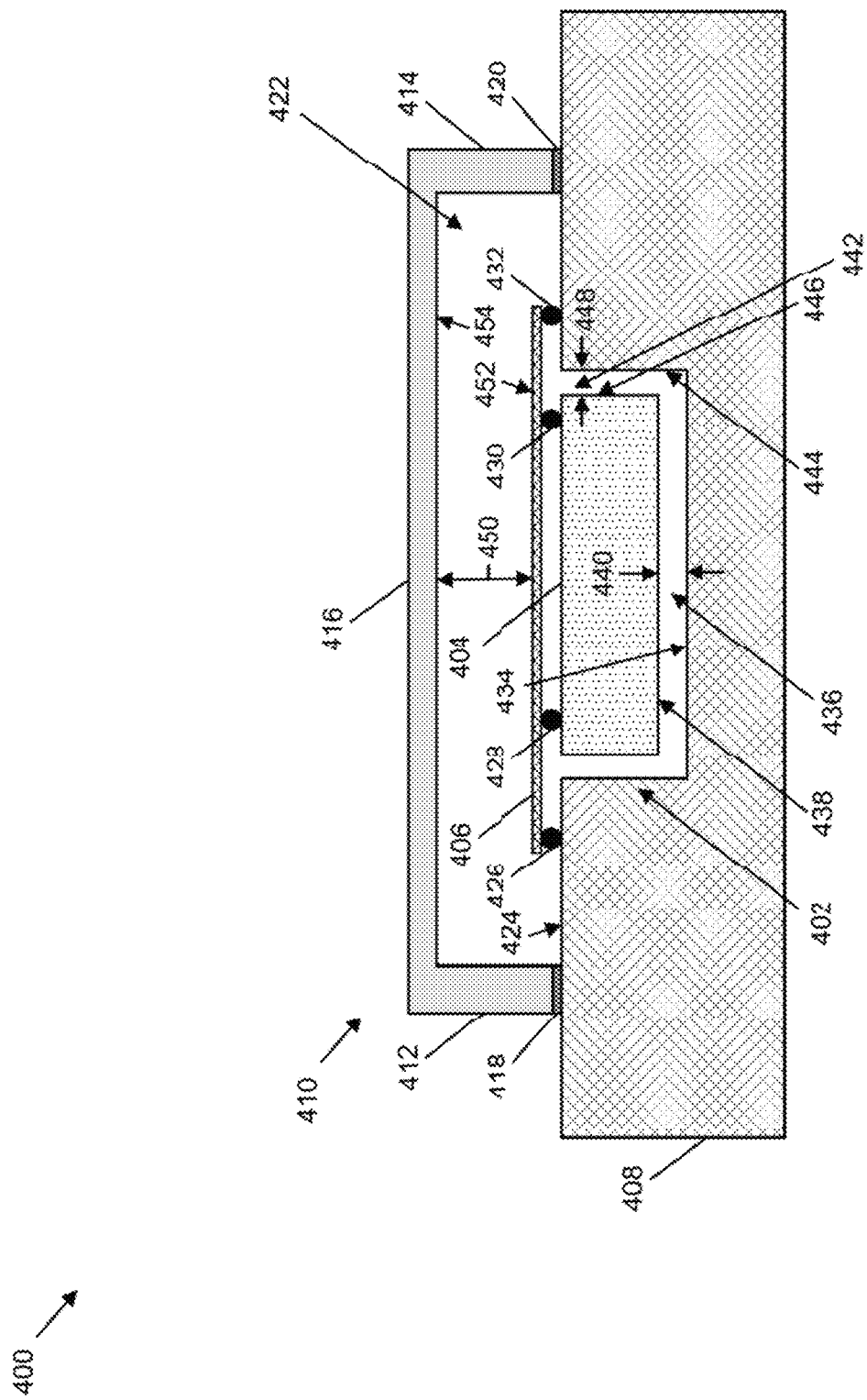
FIG. 4 is a diagram depicting a cross-section of a least a portion of an example integrated circuit package that includes a recessed region with a semiconductor die disposed in the recessed region and suspended above a surface of the recessed region using a support substrate.

FIG. 4 is a diagram depicting a cross-section of a least a portion of an example integrated circuit package 400 that includes a recessed region 402 with a semiconductor die 404 disposed in the recessed region 402 and suspended above a surface of the recessed region 402 using a support substrate 406. The semiconductor die 404 can include circuitry that is configured to perform one or more functions. In various examples, the semiconductor die 404 can include one or more electronic components, such as transistors, capacitors, resistors, inductors, one or more combinations thereof, and the like. In illustrative examples, one or more integrated circuits can be disposed on and/or within the semiconductor die 404. In illustrative examples, the integrated circuit package 400 can comprise at least a portion of the integrated circuit package 102 of FIG. 1.

The integrated circuit package 400 can include a base substrate 408 and a protective structure 410. The protective structure 410 can include a first side member 412 and a second side member 414. The first side member 412 and the second side member 414 can be disposed at least substantially parallel with respect to each other. The protective structure 410 can also include a top member 416 that is disposed at least substantially perpendicular with respect to the first side member 412 and the second side member 414. In illustrative examples, the first side member 412, the second side member 414, and the top member 416 can be a continuous piece of material.

In various implementations, the base substrate 408 and the protective structure 410 can comprise different materials. For example, the base substrate 408 can comprise a polymeric material. Additionally, the base substrate 408 can comprise a laminate material. The laminate material can include a number of layers that include one or more materials. To illustrate, the base substrate 408 can include a laminate material with a plurality of layers that are individually comprised of at least one of a polymeric material, a metallic material, or a glass material. In various examples, the base substrate 408 can include a polyimide. Further, the base substrate 408 can be comprised of an FR4 material or an FR5 material. The protective structure 410 can comprise a metallic material.

The base substrate 408 can have a coefficient of thermal expansion from about 1 ppm/° C. to about 6 ppm/° C., from about 2 ppm/° C. to about 4 ppm/° C., or from about 1 ppm/° C. to about 3 ppm/° C. In addition, a thickness of the base substrate 408 can be from about 100 micrometers to about 800 micrometers, from about 150 micrometers to about 500 micrometers, from about 400 micrometers to about 800 micrometers, from about 200 micrometers to about 400 micrometers, or from about 100 micrometers to about 200 micrometers.

The base substrate 408 can be coupled to the protective structure 410 using one or more bonding materials. To illustrate, the base substrate 408 can be coupled to the protective structure 410 using a first bonding segment 418 and a second bonding segment 420. In various examples, the one or more bonding materials can be located around at least a portion of the perimeter of the protective structure 410 to couple the protective structure 410 to the base substrate 408. The one or more bonding materials can include one or more adhesives. Additionally, the one or more bonding materials can include one or more metallic materials. For example, the protective structure 410 can be soldered to the base substrate 408.

The base substrate 408 and the protective structure 410 can form a cavity 422. The cavity 422 can be filled with a material. For example, the cavity 422 can be filled with a gas, such as air. Additionally, the cavity 422 can be filled with a gas that has a greater density value than air at 20° C. and 1 atm. To illustrate, the cavity 422 can be filled with $SF_6$. Further, the cavity 422 can be filled with a polymeric material or a dielectric material. The cavity 422 can also be filled with an oil. In various examples, the cavity 422 can be filled with a gel.

The semiconductor die 404 can be coupled to a mounting surface 424 of the base substrate 408 using the support substrate 406. The support substrate 406 can be comprised of a polymeric material. For example, the support substrate 406 can include a polyimide. Additionally, the base substrate 406 can be comprised of a laminate that includes a number of layers of one or more materials. In illustrative examples, the base substrate 406 can include a laminate material with a plurality of layers that are individually comprised of at least one of a polymeric material, a metallic material, or a glass material. Further, the base substrate 406 can comprise an FR4 material or an FR5 material. In various examples, the base substrate 406 can include one or more cut-out regions that are free of the one or more materials that comprise a remainder of the base substrate 406. The one or more cut-out regions can contribute to a reduction in the amount of stress passed through to the semiconductor die 404 in response to movement of the integrated circuit package 400.

The base substrate 406 can have a thickness that is less than a thickness of the base substrate 408. In illustrative examples, the base substrate 406 can have a thickness from about 100 micrometers to about 400 micrometers, from about 100 micrometers to about 200 micrometers, from about 200 micrometers to about 400 micrometers, or from about 100 micrometers to about 300 micrometers. The base substrate 406 can also have a coefficient of thermal expansion from about 1 ppm/° C. to about 6 ppm/° C., from about 2 ppm/° C. to about 4 ppm/° C., or from about 1 ppm/° C. to about 3 ppm/° C.

The semiconductor die 404 can be coupled to the base substrate 406 using a number of ball connectors. For example, the semiconductor die 404 can be coupled to the base substrate 406 using at least a first ball connector 426, a second ball connector 428, a third ball connector 430, and a fourth ball connector 432. The second ball connector 428 and the third ball connector 430 can couple the semiconductor die 404 to the support substrate 406 and the first ball connector 426 and the fourth ball connector 432 can couple the base substrate 406 to the mounting surface 424 of the base substrate 408. The ball connectors 426, 428, 430, 432 can be comprised of a metallic material. In illustrative examples, the ball connectors 426, 428, 430, 432 can comprise solder.

Although not shown in the illustrative example of FIG. 4, a number of electrical contacts, such as bond pads, can be disposed on at least one of the mounting surface 424 of the base substrate 408, the support substrate 406, and a contacts surface of the semiconductor die 404 to couple the semiconductor die 404 to the support substrate 406 and to the mounting surface 424 of the base substrate 408 using the ball connectors 426, 428, 430, 432. The bond pads can be comprised of metallic materials. In various examples, the ball connectors 426, 428, 430, 432 can be mechanically and electrically coupled to one or more electronic components via the semiconductor die 404, the base substrate 408, and the support substrate 406. That is, electrical signals can be communicated between one or more electronic components of the semiconductor die 404, one or more electronic components disposed on or electrically coupled to the base substrate 408, and/or one or more electronic components of the support substrate 406 using the ball connectors 426, 428, 430, 432.

In additional examples, the ball connectors 426, 428, 430, 432 can be used to mechanically couple the semiconductor die 404 to the mounting surface 424 of the base substrate 408 and to the support substrate 406 without providing electrical connections between one or more electronic components of the semiconductor die 404 to one or more electronic components that are electrically coupled to the base substrate 408 or to one or more electronic components of the support substrate 406. In these situations, additional connectors (not shown in FIG. 4) can be used to electrically couple one or more electronic components of the semiconductor die 404 to one or more additional electronic components electrically coupled to the base substrate 408 and/or one or more additional electronic components electrically coupled to the support substrate 406. In illustrative examples, traces disposed on and/or within the base substrate 408 that are interior with respect to the protective structure 410 can follow a path under the first side member 408 and the second side member 410 to route electrical signals under the first side member 412 and the second side member 414 to electronic components outside of the protective structure 410.

The support substrate 406 can be used to couple the semiconductor die 404 to the base substrate 408 such that at least a portion of the semiconductor die 404 is disposed within the recessed region 402 and is suspended above a recessed surface 434 within the recessed region 402. In this way, a suspension gap 436 is formed between the recessed surface 434 within the recessed region 402 of the base substrate 408 and a suspended surface 438 of the semiconductor die 404. The recessed surface 434 can be at least substantially parallel with respect to the suspended surface 438. The suspension gap 436 can be free of material other than one or more materials that fill the cavity 422 and/or the recessed region 402. That is, the suspension gap 436 can be free of adhesives and connectors coupling the semiconductor die 404 to the base substrate 408 and the support substrate 406. For example, the suspension gap 436 can be free of material with the exception of a gas. To illustrate, the suspension gap 436 can be free of material with the exception of air or $SF_6$. In illustrative examples, the suspension gap 436 can be free of material with the exception of an oil that is disposed in at least a portion of the cavity 422 and the recessed region 402. In additional examples, a first material that fills the cavity 422 can be different from a second material that fills the recessed region 402 including the suspension gap 436. In various examples, the cavity 422 can be filled with a gas and the portions of the recessed region 402 not occupied by the semiconductor die 404 can be occupied by an oil or a gel.

The suspension gap 436 can have a height 440 that is no greater than about 50 micrometers, no greater than about 45 micrometers, no greater than about 40 micrometers, no greater than about 35 micrometers, no greater than about 30 micrometers, or no greater than about 25 micrometers. Additionally, the suspension gap 436 can have a height 440 that is at least about 1 micrometer, at least about 5 micrometers, at least about 10 micrometers, at least about 15 micrometers, or at least about 20 micrometers. In illustrative examples, the suspension gap 436 can have a height 440 from about 1 micrometer to about 50 micrometers, from about 5 micrometers to about 40 micrometers, or from about 10 micrometers to about 30 micrometers.

Gaps can also be present within the recessed region 402 and on a side of the semiconductor die 404. For example, a gap 442 can be present between a sidewall surface 444 of the recessed region 402 and a side 446 of the semiconductor die 404. Although not expressly indicated in the illustrative example of FIG. 4, a gap can also be present on the other side of the semiconductor die 404 within the recessed region 402. The gap 442 can have a width 448 that is a same size as the height 440 of the suspension gap 436. In additional implementations, the gap 442 can have a width 448 that is different from the height 440 of the suspension gap 436. In illustrative examples, the width 448 of the gap 442 can be no greater than about 50 micrometers, no greater than about 45 micrometers, no greater than about 40 micrometers, no greater than about 35 micrometers, no greater than about 30 micrometers, or no greater than about 25 micrometers. Additionally, the gap 442 can have a width 448 that is at least about 1 micrometer, at least about 5 micrometers, at least about 10 micrometers, at least about 15 micrometers, or at least about 20 micrometers. Further, the gap 442 can have a width 448 from about 1 micrometer to about 50 micrometers, from about 5 micrometers to about 40 micrometers, or from about 10 micrometers to about 30 micrometers. A height 450 of the cavity 422 from the surface 452 of the support substrate 406 to an inner surface 454 of the top portion 416 can be from about 50 micrometers to about 200 micrometers, from about 75 micrometers to about 180 micrometers, or from about 110 micrometers to about 170 micrometers.

Further, the semiconductor die 404 can have a thickness from about 30 micrometers to about 120 micrometers, from about 40 micrometers to about 100 micrometers, or from about 50 micrometers to about 90 micrometers.

The support substrate 406 and the ball connectors 426, 428, 430, 432 can be configured to minimize displacement of the semiconductor die 404 in response to movement of the integrated circuit package 400. That is, the length, thickness, material(s), and/or physical properties of the support substrate 406 and the ball connectors 426, 428, 430, 432 can be configured to minimize displacement of the semiconductor die 404 in response to movement of the integrated circuit package 400. In illustrative examples, the support substrate 406 and the ball connectors 426, 428, 430, 432 can couple the semiconductor die 404 to the integrated circuit package 400 such that when a force up to about 50,000 g's is applied to one or more portions of the semiconductor die 404, the displacement of the semiconductor die 404 is no greater than about 3 micrometers. In additional examples, the support substrate 406 and the ball connectors 426, 428, 430, 432 can couple the semiconductor die 404 to the integrated circuit package 400 such that when a force up to 40,000 g's is applied to one or more portions of the semiconductor die 404, the displacement of the semiconductor die 404 is no greater than about 2 micrometers. In further examples, the support substrate 406 and the ball connectors 426, 428, 430, 432 can couple the semiconductor die 404 to the integrated circuit package 400 such that when a force up to 40,000 g's is applied to one or more portions of the semiconductor die 404, the displacement of the semiconductor die 404 is no greater than about 1 micrometer. The support substrate 406 and the ball connectors 426, 428, 430, 432 can couple the semiconductor die 404 to the integrated circuit package 400 such that when a force up to 30,000 g's is applied to one or more portions of the semiconductor die 404, the displacement of the semiconductor die 404 is no greater than about 1 micrometer.

Figure 5:
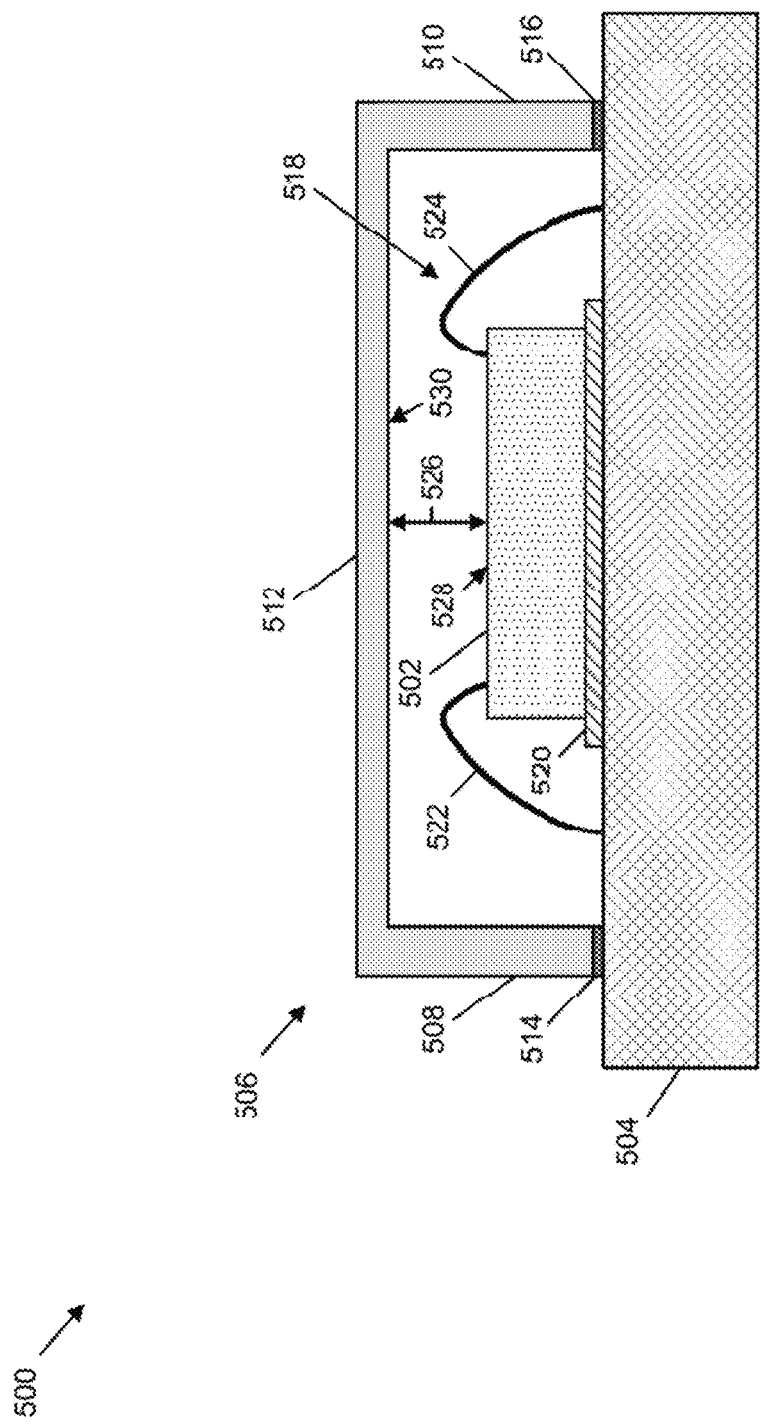
FIG. 5 is a diagram depicting a cross-section of at least a portion of an example integrated circuit package that includes components formed from materials that reduce an amount of stress exerted by the integrated circuit package on a semiconductor die contained within the integrated circuit package.

FIG. 5 is a diagram depicting a cross-section of at least a portion of an example integrated circuit package 500 that includes components formed from materials that reduce an amount of stress exerted by the integrated circuit package 500 on a semiconductor die 502 contained within the integrated circuit package 500. The semiconductor die 502 can include circuitry that is configured to perform one or more functions. In various examples, the semiconductor die 502 can include one or more electronic components, such as transistors, capacitors, resistors, inductors, one or more combinations thereof, and the like. In illustrative examples, one or more integrated circuits can be disposed on and/or within the semiconductor die 502. In illustrative examples, the integrated circuit package 500 can comprise at least a portion of the integrated circuit package 102 of FIG. 1.

The integrated circuit package 500 can include a base substrate 504 and a protective structure 506. The protective structure 506 can include a first side member 508 and a second side member 510. The first side member 508 and the second side member 510 can be disposed at least substantially parallel with respect to each other. The protective structure 506 can also include a top member 512 that is disposed at least substantially perpendicular with respect to the first side member 508 and the second side member 510. In illustrative examples, the first side member 508, the second side member 510, and the top member 512 can be a continuous piece of material.

In various implementations, the base substrate 504 and the protective structure 506 can comprise different materials. For example, the base substrate 504 can comprise a polymeric material. Additionally, the base substrate 504 can comprise a laminate material. The laminate material can include a number of layers that include one or more materials. To illustrate, the base substrate 504 can include a laminate material with a plurality of layers that are individually comprised of at least one of a polymeric material, a metallic material, or a glass material. In various examples, the base substrate 504 can include a polyimide. Further, the base substrate 504 can be comprised of an FR4 material or an FR5 material. The protective structure 506 can comprise a metallic material.

The base substrate 504 can have a coefficient of thermal expansion from about 1 ppm/° C. to about 6 ppm/° C., from about 2 ppm/° C. to about 4 ppm/° C., or from about 1 ppm/° C. to about 3 ppm/° C. In addition, a thickness of the base substrate 504 can be relatively thin and be from about 100 micrometers to about 500 micrometers, from about 300 micrometers to about 500 micrometers, or from about 200 micrometers to about 400 micrometers.

The base substrate 504 can be coupled to the protective structure 506 using one or more bonding materials. To illustrate, the base substrate 504 can be coupled to the protective structure 506 using a first bonding segment 514 and a second bonding segment 516. In various examples, the one or more bonding materials can be located around at least a portion of the perimeter of the protective structure 506 to couple the protective structure 506 to the base substrate 504. The one or more bonding materials can include one or more adhesives. Additionally, the one or more bonding materials can include one or more metallic materials. For example, the protective structure 506 can be soldered to the base substrate 504.

The base substrate 504 and the protective structure 506 can form a cavity 518. The cavity 518 can be filled with a material. For example, the cavity 518 can be filled with a gas, such as air. Additionally, the cavity 518 can be filled with a gas that has a greater density value than air at 20° C. and 1 atm. To illustrate, the cavity 518 can be filled with $SF_6$. Further, the cavity 518 can be filled with a polymeric material or a dielectric material. The cavity 518 can also be filled with an oil. In various examples, the cavity 518 can be filled with a gel.

The semiconductor die 502 can be coupled to a surface of the base substrate 504 using an adhesive layer 520. The adhesive layer 520 can have a modulus of elasticity of at least about 0.3 Gigapascals (GPa), at least about 0.5 GPa, at least about 0.8 GPa, or at least about 1 GPa. Additionally, the adhesive layer 520 can have a modulus of elasticity of no greater than about 3 GPa, no greater than about 2.5 GPa, no greater than about 2 GPa, or no greater than about 1.5 GPa. In illustrative examples, the adhesive layer 520 can have a modulus of elasticity from about 0.1 GPa to about 3 GPa, from about 0.5 GPa to about 2 GPa, from about 0.5 GPa to about 1.5 GPa, or from about 1 GPa to about 2 GPa. Although the illustrative example of FIG. 5 shows the adhesive layer 520 as being continuous, in various implementations, there can be gaps between segments of the adhesive layer 520. The adhesive layer 520 can include an epoxy-containing adhesive. Further, the adhesive layer 520 can include a boron nitride-containing adhesive.

The semiconductor die 502 can also be coupled to a mounting surface of the base substrate 504 using at least a first wire connector 522 and a second wire connector 524. The first wire connector 522 and the second wire connector 524 can be composed of a metallic material. For example, the first wire connector 522 and the second wire connector 524 can be comprised of at least one of copper, an alloy of copper, aluminum, an alloy of aluminum, gold, an alloy of gold, nickel, an alloy of nickel, titanium, an alloy of titanium, lead, an alloy of lead, tin, an alloy of tin, or one or more combinations thereof.

A distance 526 can be present between a contacts surface 528 of the semiconductor die 502 and an inner surface 530 of the top member 512. The distance 526 can be from about 20 micrometers to about 100 micrometers, from about 30 micrometers to about 90 micrometers, from about 40 micrometers to about 80 micrometers, from about 30 micrometers to about 70 micrometers, or from about 40 micrometers to about 100 micrometers. Further, the semiconductor die 502 can have a thickness from about 30 micrometers to about 120 micrometers, from about 40 micrometers to about 100 micrometers, or from about 50 micrometers to about 90 micrometers.

Although not shown in the illustrative example of FIG. 5, a number of electrical contacts, such as bond pads, can be disposed on at least one of the base substrate 504 or the semiconductor die 502 to couple the semiconductor die 502 to the base substrate 504. The bond pads can be comprised of metallic materials. In various examples, the first wire connector 522 and the second wire connector 524 can be mechanically and electrically coupled to one or more electronic components of the semiconductor die 502 and/or the base substrate 504. That is, electrical signals can be communicated between one or more electronic components of the semiconductor die 502 and one or more electronic components disposed on or electrically coupled to the base substrate 504 using the first wire connector 522 and the second wire connector 524. In additional examples, the first wire connector 522 and the second wire connector 524 can be used to mechanically couple the semiconductor die 502 to the base substrate 504 without providing electrical connections between one or more electronic components of the semiconductor die 502 to one or more electronic components that are electrically coupled to the base substrate 504. In these situations, additional connectors (not shown in FIG. 5) can be used to electrically couple one or more electronic components of the semiconductor die 502 to one or more additional electronic components electrically coupled to the base substrate 504. In illustrative examples, traces disposed on and/or within the base substrate 504 that are interior with respect to the protective structure 506 can follow a path under the first side member 508 and the second side member 510 to route electrical signals under the first side member 508 and the second side member 510 to electronic components outside of the protective structure 506.

Further, adhesive layer 520 can be configured separately, or in combination with, the first wire connector 522 and the second wire connector 524 to minimize displacement of the semiconductor die 502 in response to movement of the integrated circuit package 500. That is, the length, thickness, material(s), and/or physical properties of the adhesive layer 520 and/or the first wire connector 522 and the second wire connector 524 can be configured to minimize displacement of the semiconductor die 502 in response to movement of the integrated circuit package 500.

Figure 6:
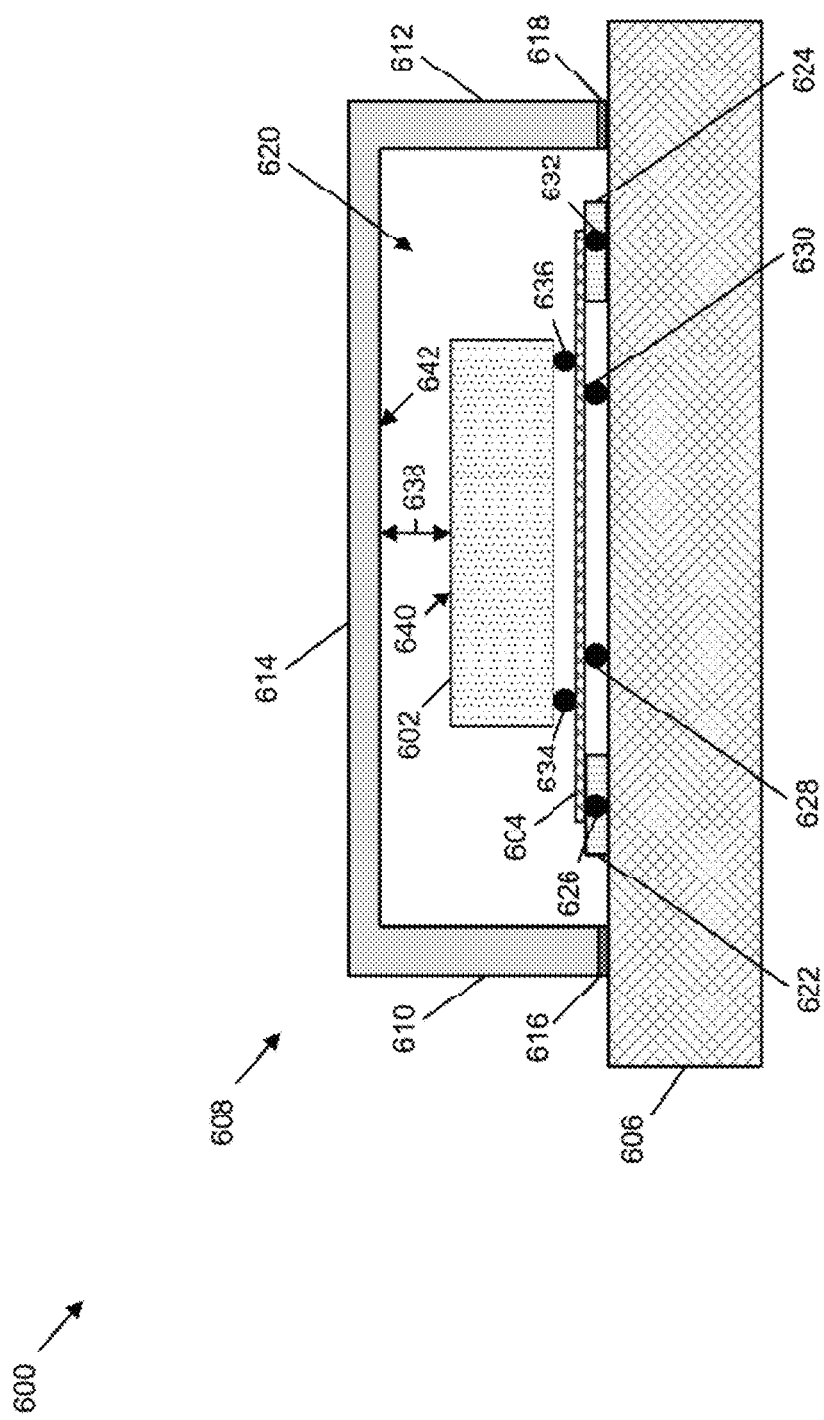
FIG. 6 is a diagram depicting a cross-section of at least a portion of an example integrated circuit package that couples a semiconductor die to the integrated circuit package using a support substrate.

FIG. 6 is a diagram depicting a cross-section of at least a portion of an example integrated circuit package 600 that couples a semiconductor die 602 to the integrated circuit package 600 using a support substrate 604. The semiconductor die 602 can include circuitry that is configured to perform one or more functions. In various examples, the semiconductor die 602 can include one or more electronic components, such as transistors, capacitors, resistors, inductors, one or more combinations thereof, and the like. In illustrative examples, one or more integrated circuits can be disposed on and/or within the semiconductor die 602. In illustrative examples, the integrated circuit package 600 can comprise at least a portion of the integrated circuit package 102 of FIG. 1.

The integrated circuit package 600 can include a base substrate 606 and a protective structure 608. The protective structure 608 can include a first side member 610 and a second side member 612. The first side member 610 and the second side member 612 can be disposed at least substantially parallel with respect to each other. The protective structure 608 can also include a top member 614 that is disposed at least substantially perpendicular with respect to the first side member 610 and the second side member 612. In illustrative examples, the first side member 610, the second side member 612, and the top member 614 can be a continuous piece of material.

In various implementations, the base substrate 606 and the protective structure 608 can comprise different materials. For example, the base substrate 606 can comprise a polymeric material. Additionally, the base substrate 606 can comprise a laminate material. The laminate material can include a number of layers that include one or more materials. To illustrate, the base substrate 606 can include a laminate material with a plurality of layers that are individually comprised of at least one of a polymeric material, a metallic material, or a glass material. In various examples, the base substrate 606 can include a polyimide. Further, the base substrate 606 can be comprised of an FR4 material or an FR5 material. The protective structure 608 can comprise a metallic material. In various examples, the support substrate 604 can include one or more cut-out regions that are free of the one or more materials that comprise a remainder of the support substrate 604. The one or more cut-out regions can contribute to a reduction in the amount of stress passed through to the semiconductor die 602 in response to movement of the integrated circuit package 600.

The base substrate 606 can have a coefficient of thermal expansion from about 1 ppm/° C. to about 6 ppm/° C., from about 2 ppm/° C. to about 4 ppm/° C., or from about 1 ppm/° C. to about 3 ppm/° C. In addition, a thickness of the base substrate 606 can be relatively thin and be from about 100 micrometers to about 500 micrometers, from about 300 micrometers to about 500 micrometers, or from about 200 micrometers to about 400 micrometers.

The base substrate 606 can be coupled to protective structure 608 using one or more bonding materials. To illustrate, the base substrate 606 can be coupled to the protective structure 608 using a first bonding segment 616 and a second bonding segment 618. In various examples, the one or more bonding materials can be located around at least a portion of the perimeter of the protective structure 608 to couple the protective structure 608 to the base substrate 606. The one or more bonding materials can include one or more adhesives. Additionally, the one or more bonding materials can include one or more metallic materials. For example, the protective structure 608 can be soldered to the base substrate 606.

The base substrate 606 and the protective structure 608 can form a cavity 620. The cavity 620 can be filled with a material. For example, the cavity 620 can be filled with a gas, such as air. Additionally, the cavity 620 can be filled with a gas that has a greater density value than air at 20° C. and 1 atm. To illustrate, the cavity 620 can be filled with $SF_6$. Further, the cavity 620 can be filled with a polymeric material or a dielectric material. The cavity 620 can also be filled with an oil. In various examples, the cavity 620 can be filled with a gel.

The semiconductor die 602 can be coupled to a mounting surface of the base substrate 606 using the support substrate 604 and an adhesive layer. In the illustrative example of FIG. 6, the adhesive layer is shown as a first adhesive segment 622 and a second adhesive segment 624. The adhesive layer 520 can have a modulus of elasticity of at least about 0.3 Gigapascals (GPa), at least about 0.5 GPa, at least about 0.8 GPa, or at least about 1 GPa. Additionally, the adhesive layer 520 can have a modulus of elasticity of no greater than about 3 GPa, no greater than about 2.5 GPa, no greater than about 2 GPa, or no greater than about 1.5 GPa. In illustrative examples, the adhesive layer can have a modulus of elasticity from about 0.1 GPa to about 3 GPa, from about 0.5 GPa to about 2 GPa, from about 0.5 GPa to about 1.5 GPa, or from about 1 GPa to about 2 GPa. The adhesive layer can include an epoxy-containing adhesive. In various examples, the adhesive layer can include a boron nitride-containing adhesive.

The support substrate 604 can be comprised of a polymeric material. For example, the support substrate 604 can include a polyimide. Additionally, the support substrate 604 can be comprised of a laminate that includes a number of layers of one or more materials. In illustrative examples, the support substrate 604 can include a laminate material with a plurality of layers that are individually comprised of at least one of a polymeric material, a metallic material, or a glass material. Further, the support substrate 604 can comprise an FR4 material or an FR5 material. The support substrate 604 can have a thickness that is less than a thickness of the base substrate 606. To illustrate, the support substrate 604 can have a thickness from about 100 micrometers to about 500 micrometers, from about 200 micrometers to about 400 micrometers, or from about 300 micrometers to about 500 micrometers. The support substrate 604 can also have a coefficient of thermal expansion from about 1 ppm/° C. to about 6 ppm/° C., from about 2 ppm/° C. to about 4 ppm/° C., or from about 1 ppm/° C. to about 3 ppm/° C.

The support substrate 604 can also be coupled to the base substrate 606 using a first number of connectors that can include at least a first ball connector 626, a second ball connector 628, a third ball connector 630, and a fourth ball connector 632. In the illustrative example of FIG. 6, the first ball connector 626 and the fourth ball connector 632 can be encased in the adhesive layer. Additionally, the semiconductor die 602 can be coupled to the support substrate 604 using a second number of connectors that can include at least the fifth ball connector 634 and the sixth ball connector 636. In illustrative examples, the ball connectors 626, 628, 630, 632, 634, 636 can comprise a metallic material. For example, the ball connectors 626, 628, 630, 632, 634, 636 can comprise solder.

Although not shown in the illustrative example of FIG. 6, a number of electrical contacts, such as bond pads, can be disposed on at least one of the base substrate 606, the support substrate 604, or the semiconductor die 602 to couple the semiconductor die 602 to the support substrate 604 and to couple the support substrate 604 to the base substrate 606. The bond pads can be comprised of metallic materials. In various examples, a portion of the ball connectors 626, 628, 630, 632 can be coupled to the base substrate 606 by soldering to bond pads, while another portion of the ball connectors 626, 628, 630, 632 are not soldered to the base substrate 606. For example, the first ball connector 626 and the fourth ball connector 632 can be soldered to the base substrate 606 using bond pads and the second ball connector 628 and the third ball connector 630 may not be soldered to the base substrate 606 using bond pads.

The ball connectors 626, 628, 630, 632, 634, 636 can be mechanically and electrically coupled to one or more electronic components via the semiconductor die 602, the support substrate 604, and the base substrate 606. That is, electrical signals can be communicated between one or more electronic components of the semiconductor die 602, one or more electronic components disposed on or electrically coupled to the support substrate 604, and/or one or more electronic components of the base substrate 606 using the ball connectors 626, 628, 630, 632, 634, 636. In additional examples, the ball connectors 626, 628, 630, 632, 634, 636 can be used to mechanically couple the semiconductor die 602 to the support substrate 604 and to the base substrate 606 without providing electrical connections between one or more electronic components of the semiconductor die 602 to one or more electronic components that are electrically coupled to the support substrate 604 or to one or more electronic components of the base substrate 606. In these situations, additional connectors (not shown in FIG. 6) can be used to electrically couple one or more electronic components of the semiconductor die 602 to one or more additional electronic components electrically coupled to the support substrate 604 and/or one or more additional electronic components electrically coupled to the base substrate 606. In illustrative examples, traces disposed on and/or within the base substrate 606 that are interior with respect to the protective structure 608 can follow a path under the first side member 610 and the second side member 612 to route electrical signals under the first side member 610 and the second side member 612 to electronic components outside of the protective structure 608.

A distance 638 can be present between a contacts surface 640 of the semiconductor die 602 and an inner surface 642 of the top member 614. The distance 638 can be from about 20 micrometers to about 100 micrometers, from about 30 micrometers to about 90 micrometers, from about 40 micrometers to about 80 micrometers, from about 30 micrometers to about 70 micrometers, or from about 40 micrometers to about 100 micrometers. Further, the semiconductor die 602 can have a thickness from about 30 micrometers to about 120 micrometers, from about 40 micrometers to about 100 micrometers, or from about 50 micrometers to about 90 micrometers.

The support substrate 604 and the adhesive layer can be configured to minimize displacement of the semiconductor die 602 in response to movement of the integrated circuit package 600. That is, the length, thickness, material(s), and/or physical properties of the support substrate 604, the first adhesive layer segment 622, and the second adhesive layer segment 624 can be configured to minimize displacement of the semiconductor die 602 in response to movement of the integrated circuit package 600.

Figure 7:
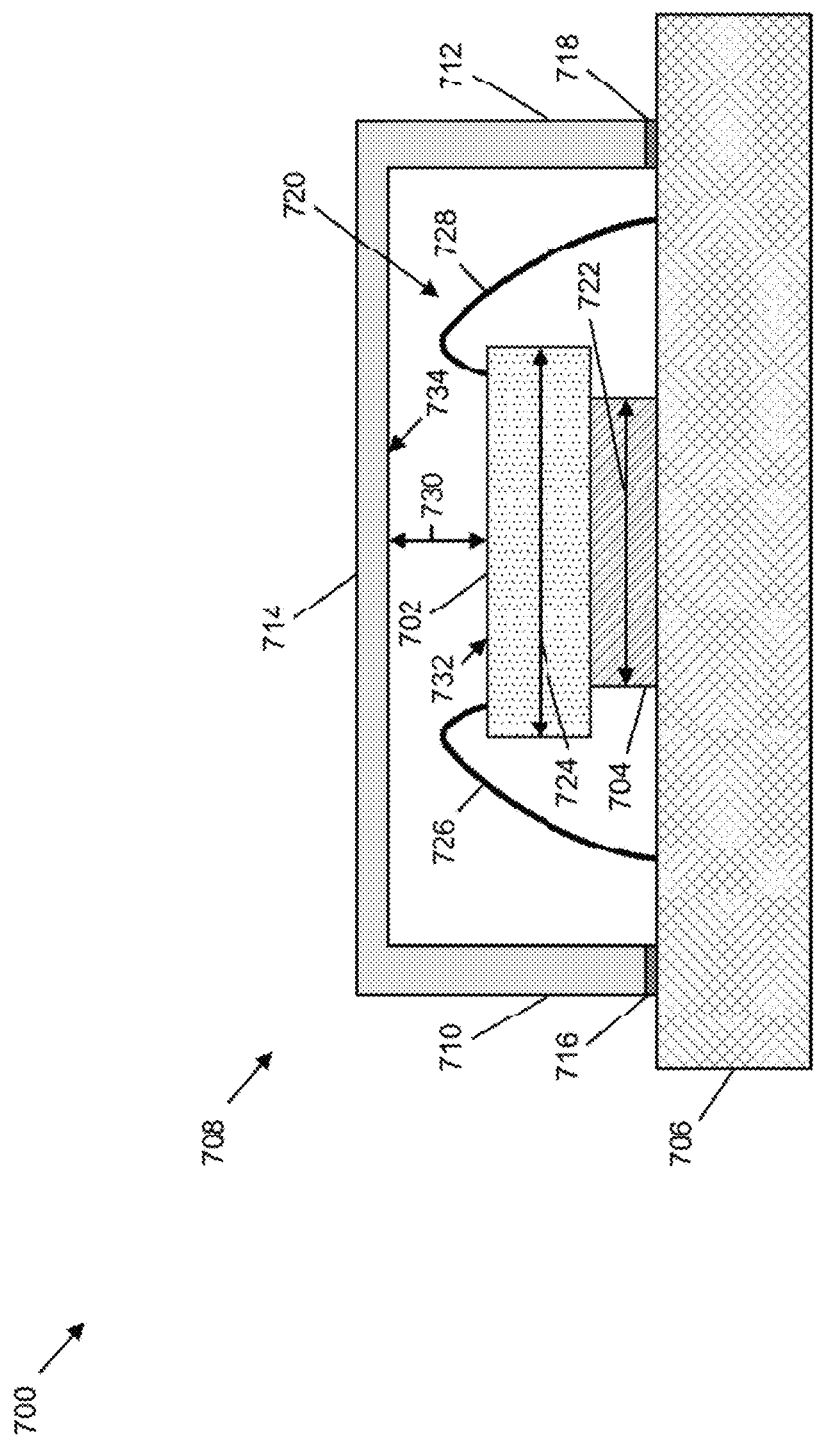
FIG. 7 is a diagram depicting a cross-section of at least a portion of an example integrated circuit package that couples a semiconductor die to the integrated circuit package using an intermediate spacing component.

FIG. 7 is a diagram depicting a cross-section of at least a portion of an example integrated circuit package 700 that couples a semiconductor die 702 to the integrated circuit package 700 using an intermediate spacing component 704. The semiconductor die 702 can include circuitry that is configured to perform one or more functions. In various examples, the semiconductor die 702 can include one or more electronic components, such as transistors, capacitors, resistors, inductors, one or more combinations thereof, and the like. In illustrative examples, one or more integrated circuits can be disposed on and/or within the semiconductor die 702. In illustrative examples, the integrated circuit package 700 can comprise at least a portion of the integrated circuit package 102 of FIG. 1.

The integrated circuit package 700 can include a base substrate 706 and a protective structure 708. The protective structure 708 can include a first side member 710 and a second side member 712. The first side member 710 and the second side member 712 can be disposed at least substantially parallel with respect to each other. The protective structure 708 can also include a top member 714 that is disposed at least substantially perpendicular with respect to the first side member 710 and the second side member 712.

In illustrative examples, the first side member 710, the second side member 712, and the top member 714 can be a continuous piece of material.

In various implementations, the base substrate 706 and the protective structure 708 can comprise different materials. For example, the base substrate 706 can comprise a polymeric material. Additionally, the base substrate 706 can comprise a laminate material. The laminate material can include a number of layers that include one or more materials. To illustrate, the base substrate 706 can include a laminate material with a plurality of layers that are individually comprised of at least one of a polymeric material, a metallic material, or a glass material. In various examples, the base substrate 706 can include a polyimide. Further, the base substrate 706 can be comprised of an FR4 material or an FR5 material. The protective structure 708 can comprise a metallic material.

The base substrate 706 can have a coefficient of thermal expansion from about 1 ppm/° C. to about 6 ppm/° C., from about 2 ppm/° C. to about 4 ppm/° C., or from about 1 ppm/° C. to about 3 ppm/° C. In addition, a thickness of the base substrate 706 can be relatively thin and be from about 100 micrometers to about 500 micrometers, from about 200 micrometers to about 400 micrometers, or from about 300 micrometers to about 500 micrometers.

The base substrate 706 can be coupled to the protective structure 708 using one or more bonding materials. To illustrate, the base substrate 706 can be coupled to the protective structure 708 using a first bonding segment 716 and a second bonding segment 718. In various examples, the one or more bonding materials can be located around at least a portion of the perimeter of the protective structure 708 to couple the protective structure 708 to the base substrate 706. The one or more bonding materials can include one or more adhesives. Additionally, the one or more bonding materials can include one or more metallic materials. For example, the protective structure 708 can be soldered to the base substrate 706.

The base substrate 706 and the protective structure 708 can form a cavity 720. The cavity 720 can be filled with a material. For example, the cavity 720 can be filled with a gas, such as air. Additionally, the cavity 720 can be filled with a gas that has a greater density value than air at 20° C. and 1 atm. To illustrate, the cavity 720 can be filled with $SF_6$. Further, the cavity 720 can be filled with a polymeric material or a dielectric material. The cavity 720 can also be filled with an oil. In various examples, the cavity 720 can be filled with a gel.

The intermediate spacing component 704 can have a width 722 that is less than a width 724 of the semiconductor die 702. The width 722 can be from about 50 micrometers to about 400 micrometers, from about 75 micrometers to about 300 micrometers, from about 100 micrometers to about 200 micrometers, or from about 50 micrometers to about 150 micrometers. In various examples, the intermediate spacing component 704 can comprise one or more materials that are different from one or more materials of the semiconductor die 702. In additional examples, the intermediate spacing component 704 can comprise one or more materials that are the same as one or more materials of the semiconductor die 702. In illustrative examples, the intermediate spacing component 704 and the semiconductor die 702 can both comprise an amount of silicon. The intermediate spacing component 704 can also be comprised of one or more polymeric materials. For example, intermediate spacing component 704 can comprise a polymeric material having a modulus of elasticity from about 1 ppm/° C. to about 5 ppm/° C. or from about 2 ppm/° C. to about 4 ppm/° C. Further, the intermediate spacing component 704 and the semiconductor die 702 can be coupled using one or more bonding materials, such as one or more adhesives.

The semiconductor die 702 can also be coupled to a mounting surface of the base substrate 710 using at least a first wire connector 726 and a second wire connector 728. The first wire connector 726 and the second wire connector 728 can be composed of a metallic material. For example, the first wire connector 726 and the second wire connector 728 can be comprised of at least one of copper, an alloy of copper, aluminum, an alloy of aluminum, gold, an alloy of gold, nickel, an alloy of nickel, titanium, an alloy of titanium, lead, an alloy of lead, tin, an alloy of tin, or one or more combinations thereof.

A distance 730 can be present between a contacts surface 732 of the semiconductor die 702 and an inner surface 734 of the top member 714. The distance 730 can be from about 20 micrometers to about 100 micrometers, from about 30 micrometers to about 90 micrometers, from about 40 micrometers to about 80 micrometers, from about 30 micrometers to about 70 micrometers, or from about 40 micrometers to about 100 micrometers. Further, the semiconductor die 702 can have a thickness from about 30 micrometers to about 120 micrometers, from about 40 micrometers to about 100 micrometers, or from about 50 micrometers to about 90 micrometers.

Although not shown in the illustrative example of FIG. 7, a number of electrical contacts, such as bond pads, can be disposed on at least one of the base substrate 706 or the semiconductor die 702 to couple the semiconductor die 702 to the base substrate 706. The bond pads can be comprised of metallic materials. In various examples, the first wire connector 726 and the second wire connector 728 can be mechanically and electrically coupled to one or more electronic components of the semiconductor die 702 and/or the base substrate 706 via one or more bond pads. That is, electrical signals can be communicated between one or more electronic components of the semiconductor die 702 and one or more electronic components disposed on or electrically coupled to the base substrate 706 using the first wire connector 726 and the second wire connector 728. In additional examples, the first wire connector 726 and the second wire connector 728 can be used to mechanically couple the semiconductor die 702 to the base substrate 706 without providing electrical connections between one or more electronic components of the semiconductor die 702 to one or more electronic components that are electrically coupled to the base substrate 706. In these situations, additional connectors (not shown in FIG. 7) can be used to electrically couple one or more electronic components of the semiconductor die 702 to one or more additional electronic components electrically coupled to the base substrate 706. In illustrative examples, traces disposed on and/or within the base substrate 706 that are interior with respect to the protective structure 708 can follow a path under the first side member 710 and the second side member 712 to route electrical signals under the first side member 710 and the second side member 712 to electronic components outside of the protective structure 708.

Further, the intermediate spacing component 704 can be configured separately, on in combination with, the first wire connector 726 and the second wire connector 728 to minimize displacement of the semiconductor die 702 in response to movement of the integrated circuit package 700. That is, the length, thickness, material(s), and/or physical properties of the intermediate spacing component 704 and/or the first wire connector 726 and the second wire connector 728 can be configured to minimize displacement of the semiconductor die 702 in response to movement of the integrated circuit package 700.

Figure 8:
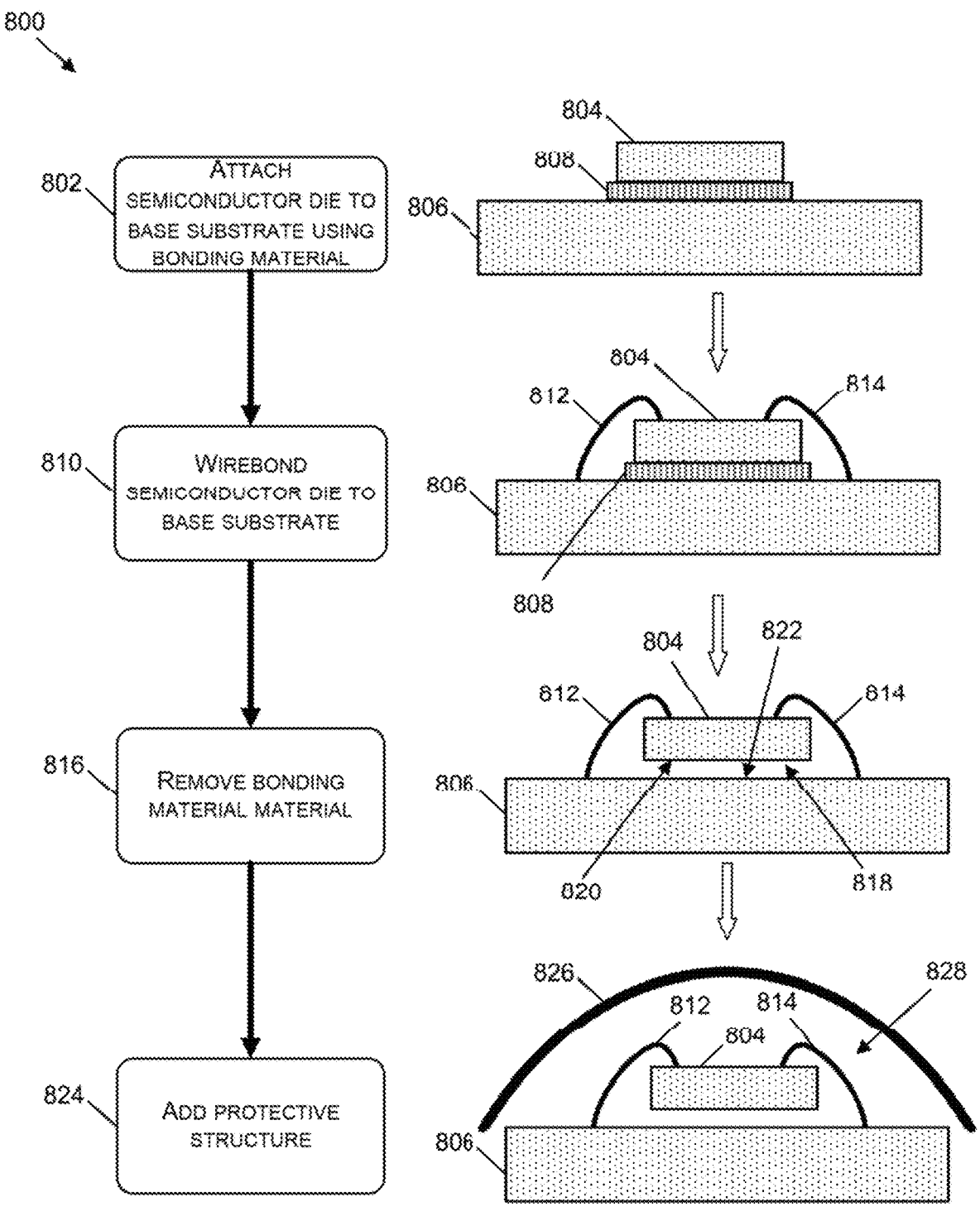
FIG. 8 is a diagram depicting a process to produce an integrated circuit package coupled to a semiconductor die within the integrated circuit package using wire connectors.

FIG. 8 is a diagram depicting a process 800 to produce an integrated circuit package coupled to a semiconductor die within the integrated circuit package using wire connectors. The process 800 can include, at operation 802, attaching a semiconductor die 804 to a base substrate 806 using a bonding material 808. The bonding material 808 can include one or more adhesives. In addition, the bonding material can have a composition that enables the temporary bonding of the semiconductor die 804 to the base substrate 806.

The base substrate 806 can comprise silicon, in example implementations. Additionally, the base substrate 806 can comprise a polymeric material. To illustrate, the base substrate 806 can comprise a laminate material that includes a number of layers with individual layers that include at least one of a polymeric material, a metallic material, or a glass material. For example, the base substrate 806 can comprise an FR4 material or an FR5 material. The bonding material 808 can comprise a polymeric material. In various examples, the bonding material 808 can comprise a thermosetting polymeric material. Further, the bonding material 808 can comprise an epoxy.

In illustrative examples, an amount of the bonding material 808 can be placed on the base substrate 806 and the semiconductor die 804 can then be placed on the amount of bonding material 808. To illustrate, a screen printing process can be used disposed the amount of bonding material 808 onto the base substrate 806 and/or onto the semiconductor die 804. A process can be used to cure the amount of bonding material 808. For example, the bonding material 808 can be subjected to a range of wavelengths of electromagnetic radiation for a period of time to cure the bonding material 808. In additional examples, the amount of bonding material 808 can be subjected to temperatures within a particular range for a period of time to cure the amount of the bonding material 808. In various examples, the bonding material 808 can be partially cured when applied to the semiconductor die 804 and/or to the base substrate 806 and then fully cured after the semiconductor die 804 and the base substrate 806 are coupled together. In additional examples, the semiconductor die 804 and/or the base substrate 806 can be heated before applying the bonding material 808.

At operation 810, the semiconductor die 804 can be wirebonded to the base substrate 806. For example, the semiconductor die 804 can be attached to the base substrate 806 using a number of wire connectors that includes at least the first wire connector 812 and the second wire connector 814. The first wire connector 812 and the second wire connector 814 can be comprised of a metallic material. The first wire connector 812 and the second wire connector 814 can be coupled to respective bond pads on the semiconductor die 804 and the base substrate 806. In illustrative examples, the first wire connector 812 and the second wire connector 814 can be soldered to bond pads on the semiconductor die 804 and the base substrate 806.

The first wire connector 812 and the second wire connector 814 can provide mechanical connections between the semiconductor die 804 and the base substrate 806, as well as electrical connections between electronic components of the semiconductor die 804 and electronic components coupled to the base substrate 806. In additional examples, the first wire connector 812 and the second wire connector 814 can provide mechanical connections between the semiconductor die 804 and the base substrate 806 and not electrical connections. Further, the first wire connector 812 and the second wire connector 814 can have properties that can limit the displacement of the semiconductor die 804 in response to movement of an integrated circuit package that includes the semiconductor die 804. For example, the first wire connector 812 and the second wire connector 814 can be comprised of one or more materials with mechanical spring characteristics that can enable some movement of the semiconductor die 804 in response to a force being applied to at least a portion of the semiconductor die 804 while limiting the displacement of the semiconductor die 804 in a manner that minimizes the possibility of damage to electronic components of the semiconductor die 804.

The process 800 can include, at operation 816, removing the bonding material 808. The bonding material 808 can be removed using one or more chemical processes. After removing the bonding material 808, the semiconductor die 804 can be suspended above the base substrate 806. For example, the semiconductor die 804 can be disposed above the base substrate 806 such that the semiconductor die 804 does not directly contact a surface of the base substrate 806. In this way, a suspension gap 818 is formed between a surface 820 of the semiconductor die 804 and a surface 822 of the base substrate 806 such that the contact between the semiconductor die 804 and the base substrate 806 is indirectly through the first wire connector 812 and the second wire connector 814.

Although not shown in the illustrative embodiment of FIG. 8, in additional implementations, at least a portion of the bonding material 808 can remain coupling the semiconductor die 804 to the base substrate 806. In these implementations, the bonding material 808 can have one or more properties that help minimize the impact on electronic components of the semiconductor die of movement of an integrated circuit package that includes the semiconductor die 804. For example, the modulus of elasticity of the bonding material 808 can result in minimizing the amount of stress placed on the semiconductor die 804 in response to movement of an integrated circuit package that includes the semiconductor die 804.

Further, the process 800 can include, at operation 824, adding a protective structure 826 that covers at least the semiconductor die 804, the first wire connector 812 and the second wire connector 814. The protective structure 826 can also cover at least a portion of the base substrate 806. The protective structure 826 can comprise a same material as the base substrate 806. For example, the protective structure 826 can comprise silicon and the protective structure 826 can also comprise silicon. In various examples, the base substrate 806 and the protective structure 826 can form a continuous structure comprised of a same material or comprised of a same composition.

In additional implementations, the base substrate 806 and the protective structure 826 can be comprised of different materials. To illustrate, the protective structure 826 can be comprised of a metallic material and the base substrate 806 can be comprised of a polymeric material or a silicon-containing material. In these implementations, the protective structure 826 can be coupled to the base substrate 806 using one or more bonding materials. For example, an amount of a bonding material can be disposed on the protective structure 826 and/or on the base substrate 806 and the protective structure 826 can be contacted with the base substrate 806 via the amount of bonding material.

The protective structure 826 can form a cavity 828 in which the semiconductor die 804, the first wire connector 812, and the second wire connector 814 are located. In illustrative examples, the cavity 828 can be filled with one or more liquids, such as an oil. In additional examples, the cavity 828 can be filled with one or more gases. To illustrate, the cavity 828 can be filled with air. Further, the cavity 828 can be filled with a gas that has a greater density value than air at 20° C. and 1 atm, such as $SF_6$. The cavity 828 can also be filled with one or more solid materials. For example, the cavity 828 can be filled with a dielectric material. Additionally, the cavity 828 can be filled with a gel.

The process 800 can be used to produce an integrated circuit package that contains the semiconductor die 804 and includes at least the base substrate 806, the first wire connector 812, the second wire connector 814, and the protective structure 826. For example, the process 800 can be used to produce the integrated circuit package 200 described with respect to FIG. 2. In addition, the process 800 can be used to produce the integrated circuit package 500 of FIG. 5. The integrated circuit package can be coupled to a printed circuit board, in various implementations. Further, the integrated circuit package produced using the process 800 can be housed in an additional integrated circuit package that can include an additional protective structure and/or an additional material to encase the integrated circuit package.

Figure 9:
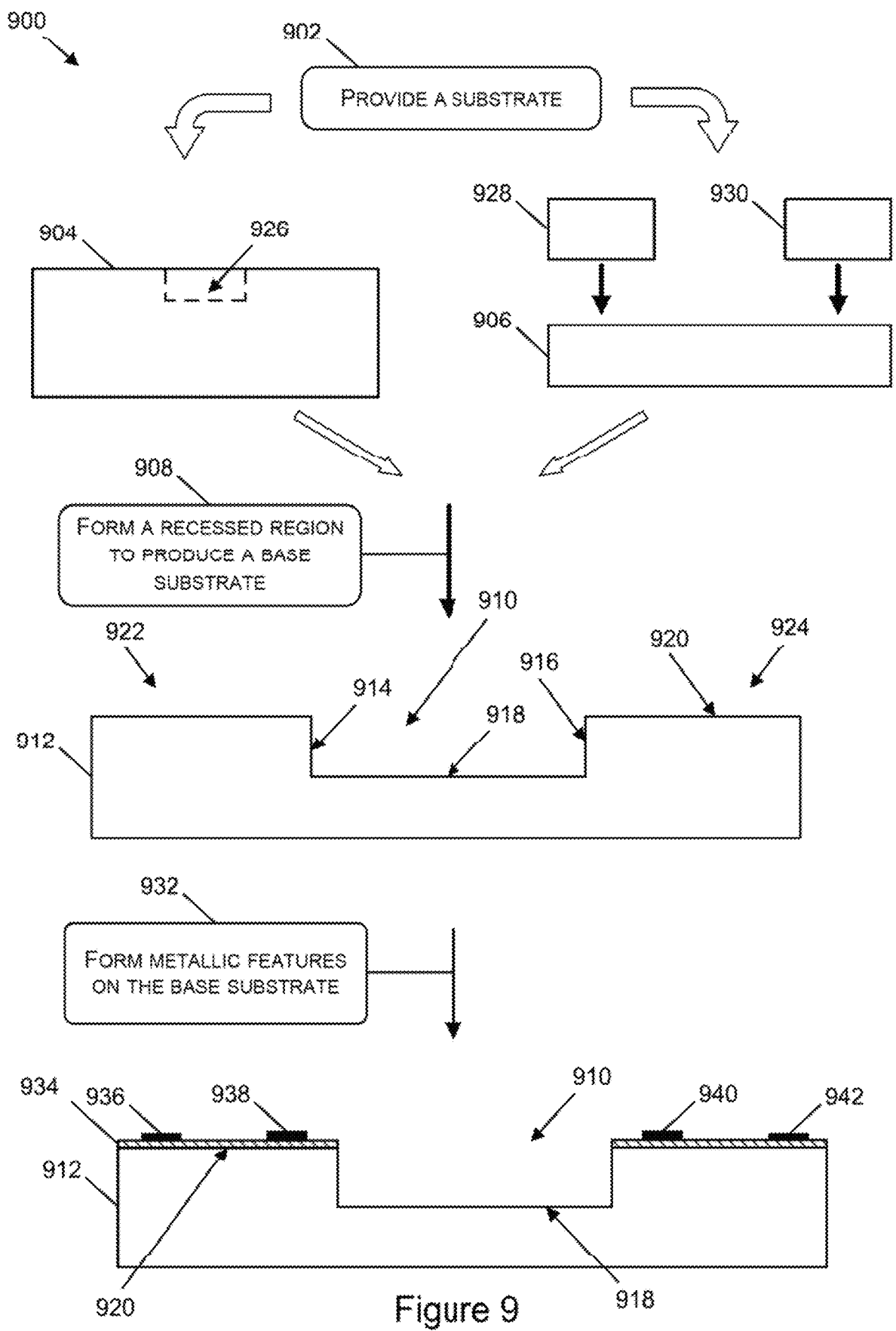
FIG. 9 is a diagram depicting first operations of a process to produce an integrated circuit package that includes a recessed region and a semiconductor die disposed within the recessed region.

FIG. 9 is a diagram depicting first operations of a process 900 to produce an integrated circuit package that includes a recessed region and a semiconductor die disposed within the recessed region. At operation 902, the process 900 can include providing a substrate, such as a first substrate 904 or a second substrate 906. The first substrate 904 and the second substrate 906 can have different compositions and different properties in various implementations. For example, the first substrate 904 can comprise silicon and the second substrate 906 can comprise a polymeric material. In illustrative examples, the second substrate 906 can include a laminate substrate that includes a plurality of layers that individually include at least one of a polymeric material, a metallic material, or a glass material. In additional examples, both the first substrate 904 and the second substrate 906 can comprise silicon. In further examples, both the first substrate and the second substrate 906 can include a laminate material.

The process 900 can also include, at operation 908, forming a recessed region 910 to produce a base substrate 912. The recessed region 910 can include an opening in the base substrate 912. The recessed region 910 can include a first side surface 914 and a second side surface 916 that is at least substantially parallel to the first side surface 914. Additionally, the recessed region 910 can include a lower surface 918. The lower surface 918 can be disposed at least substantially perpendicular with respect to the first side surface 914 and the second side surface 916. Further, the base substrate 912 can include an upper surface 920. The upper surface 920 can be divided into two segments with a first segment 922 being disposed on one side of the recessed region 910 and a second segment 924 being disposed on another side of the recessed region 910.

The recessed region 910 can be formed using various methods. For example, a trench can be formed in a region 926 of the first substrate 904. The trench can be formed in the region 926 by etching a material of the first substrate 904 using one or more chemical etching processes. In additional examples, the trench can be formed in the region 926 by using one or more mechanical processes, such as one or more sawing operations and/or chemical mechanical polishing (CMP) operations.

In further examples, the recessed region 910 can be formed by coupling a first side component 928 and a second side component 930 to the second substrate 906. In this way, a portion of the first side component 928 can form the first side surface 914 of the recessed region 910 and the second side component 930 can form the second side surface 916 of the recessed region 906. The first side component 928 and the second side component 930 can be comprised of one or more of the same materials as at least one of the materials that forms the second substrate 906. To illustrate, the second substrate 906, the first side component 928, and the second side component 930 can be comprised of a laminate material. In further examples, the second substrate 906, the first side component 928, and the second side component 930 can be comprised of silicon.

The first side component 928 and the second side component 930 can be coupled to the second substrate 906 using one or more bonding materials. The one or more bonding materials can include one or more adhesives. In additional examples, the one or more bonding materials can include one or more metals. In various implementations, a metallic region of the first side component 928 can be bonded to a first metallic region of the second substrate 906 and a metallic region of the second side component 930 can be bonded to a second metallic region of the second substrate 906.

Additionally, the process 900 can include, at operation 932, forming metallic features on the base substrate 912. The metallic features can be disposed on the upper surface 920 of the base substrate 912. A base layer 934 can be disposed on the top surface 920 of the base substrate 912 before forming the metallic features on the base substrate 912. The base layer 934 can comprise a polymeric material. In illustrative examples, the base layer 934 can comprise a laminate material that includes a number of layers that individually include at least one of one or more polymeric materials, one or more metallic materials, or one or more glass materials. In various examples, the base layer 934 can be omitted from an integrated circuit package produced by the process 900.

The metallic features formed on the base substrate 912 can include at least a first bond pad 936, a second bond pad 938, a third bond pad 940, and a fourth bond pad 942. The bond pads 936, 938, 940, 942 can comprise one or more metallic materials. For example, the bond pads 936, 938, 940, 942 can comprise at least one of aluminum, an alloy of aluminum, copper, an alloy of copper, silver, an alloy of silver, gold, an alloy of gold, nickel, an alloy of nickel, titanium, an alloy of titanium, or one or more combinations thereof.

Figure 10:
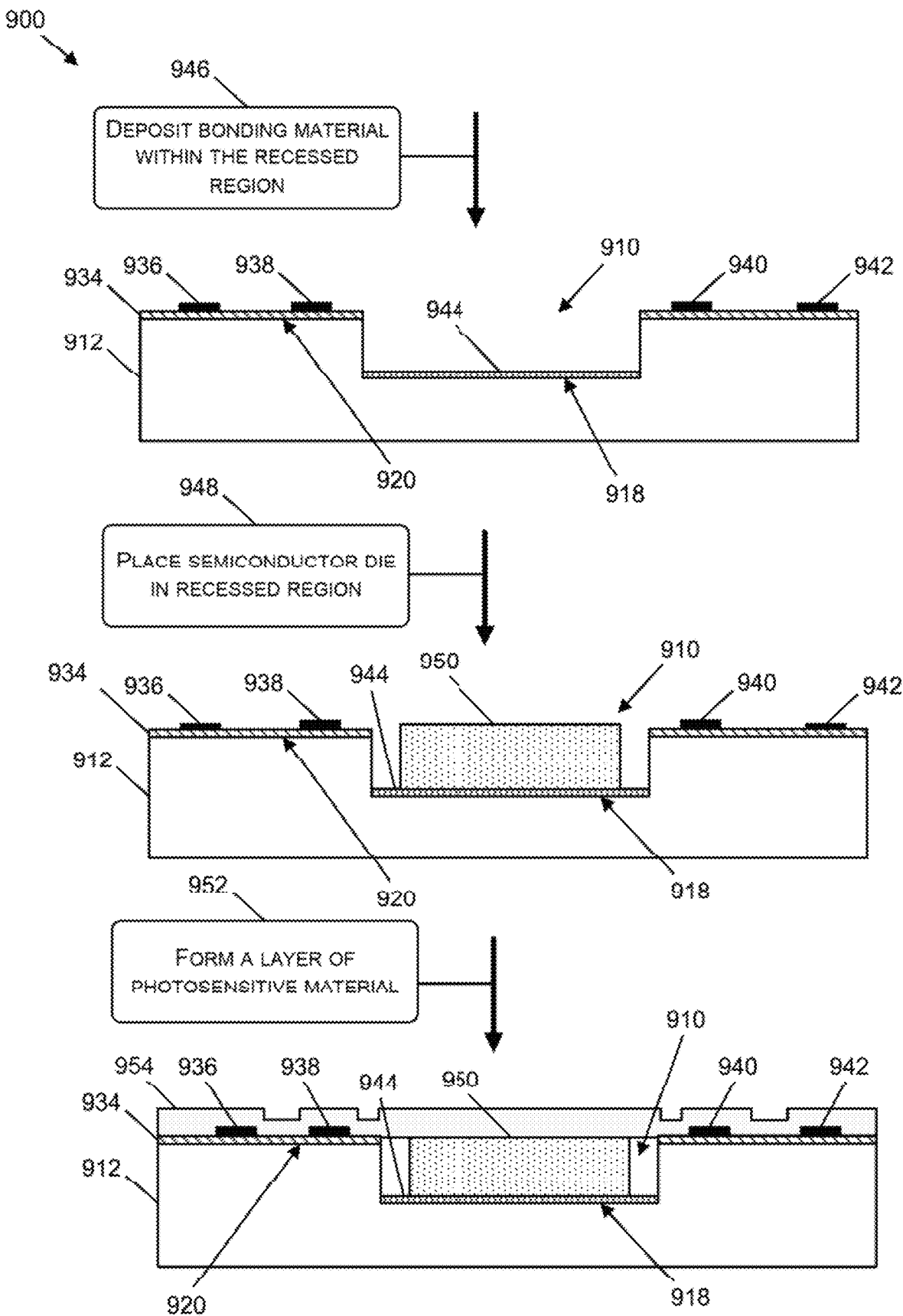
FIG. 10 is a diagram depicting second operations of a process to produce an integrated circuit package that includes a recessed region and a semiconductor die disposed within the recessed region.

FIG. 10 is a diagram depicting second operations of a process 900 to produce an integrated circuit package that includes a recessed region and a semiconductor die disposed within the recessed region. An amount of bonding material 944 can be deposited onto the lower surface 918 of the recessed region 910 at operation 946 of the process 900. The bonding material 944 can include one or more adhesives that can be used to couple one or more objects to the lower surface 918 of the recessed region 910. The bonding material 944 can include a polymeric material. In illustrative examples, the bonding material 944 can comprise a thermoset polymeric material. Additionally, the bonding material 944 can include an epoxy.

At 948, the process 900 can include placing a semiconductor die 950 into the recessed region 910. the semiconductor die 950 can be coupled to the lower surface 918 of the recessed region by the amount of the bonding material 944. The semiconductor die 950 can be placed in the recessed region 910 such that at least a portion of the semiconductor die 950 is disposed below the upper surface 920. In various implementations, the amount of the bonding material 944 can be at least partially cured after the semiconductor die 950 is placed in the recessed region 910. The curing of the bonding material 944 can take place by exposing the bonding material 944 to specified wavelengths of electromagnetic radiation for a period of time and/or exposing the bonding material 944 to a range of temperatures for a period of time.

The process 900 can also include, at operation 952, forming a layer of photosensitive material 954. The layer of photosensitive material 954 can be disposed over the base layer 934, the bond pads 936, 938, 940, 942 and the semiconductor die 950. The layer of photosensitive material 954 can also cover exposed portions of the recessed region 910. The layer of photosensitive material 954 can comprise a negative photoresist. In additional examples, the layer of photosensitive material 954 can comprise a positive photoresist.

Figure 11:
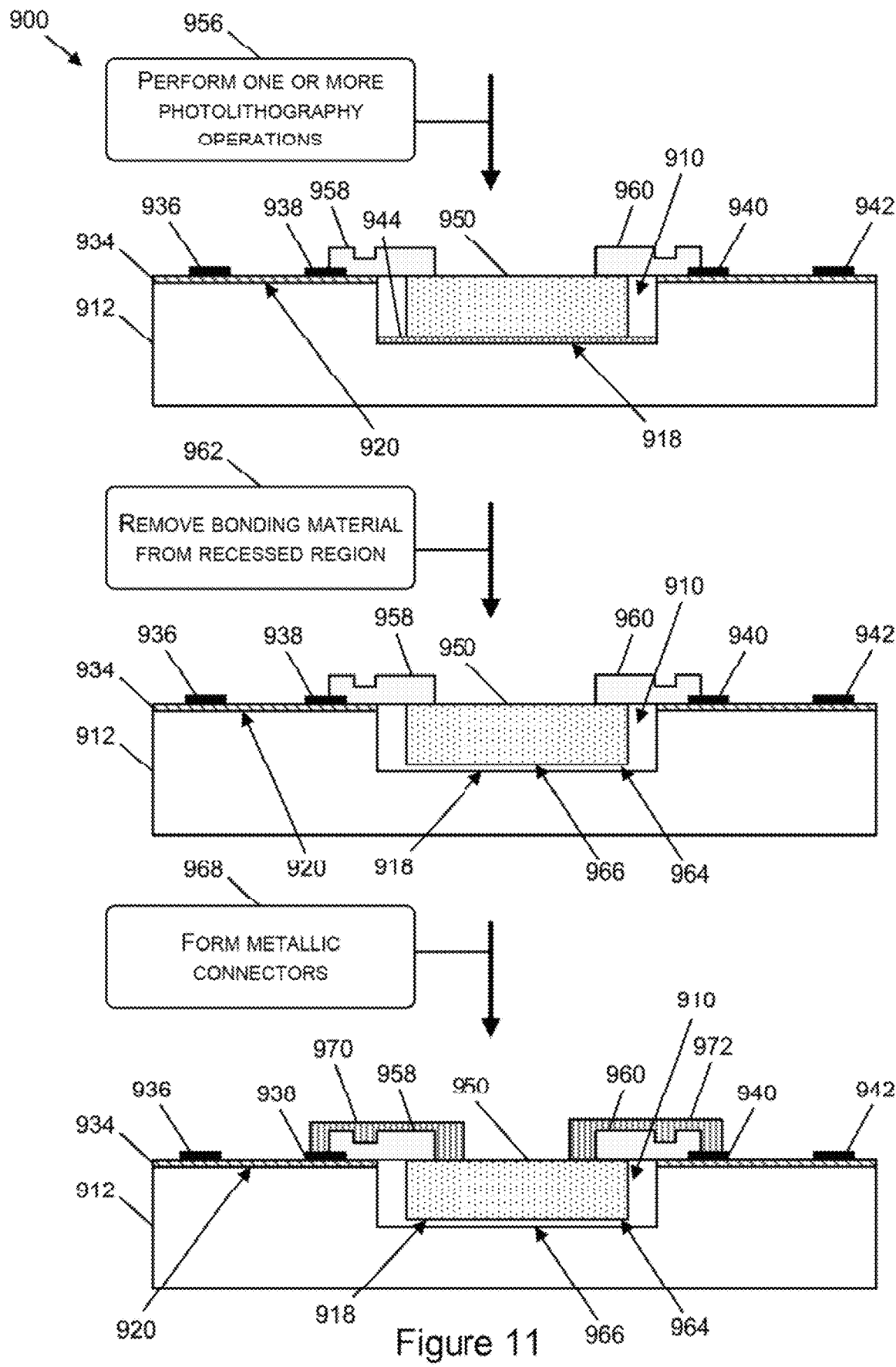
FIG. 11 is a diagram depicting third operations of a process to produce an integrated circuit package that includes a recessed region and a semiconductor die disposed within the recessed region.

FIG. 11 is a diagram depicting third operations of a process 900 to produce an integrated circuit package that includes a recessed region and a semiconductor die disposed within the recessed region. For example, at operation 956, the process 900 can include performing one or more photolithography operations. The one or more photolithography operations can include patterning the layer of photosensitive material 954 and removing a portion of the layer of photosensitive material 954 to produce a first connector support 958 and a second connector support 960. The portion of the layer of photosensitive material 954 that is removed can be dissolved using one or more chemical etching processes.

At operation 962, the bonding material 944 can be removed to produce a suspension gap 964 between the lower surface 918 of the recessed region 910 and a surface 966 of the semiconductor die 950. The bonding material 944 can be removed using one or more chemical etching processes. The first connector support 958 and the second connector support 960 can suspend the semiconductor die 950 above the lower surface 918 such that the surface 966 of the semiconductor die 950 does not contact the lower surface 918. Although the illustrative example of FIG. 11 shows the bonding material being removed after the formation of the first connector support 958 and the second connector support 960, the bonding material 944 can also be removed at other times. for example, the bonding material 944 can also be removed in conjunction with the one or more photolithography operations used to form the first connector support 958 and the second connector support 960. Additionally, the bonding material 944 can be removed after the layer of photosensitive material 954 is formed and before the first connector support 958 and the second connector support 960 are formed.

Further, the process 900 can include, at operation 968, forming a plurality of metallic connectors. For example, a first metallic connector 970 can be formed over the first connector support 958 and a second metallic connector 972 can be formed over the second connector support 960. The first metallic connector 970 and the second metallic connector 972 can be formed by depositing a metallic layer over the first connector support 958, the second connector support 960, and over other features disposed on the upper surface 920, such as at least one of exposed portions of the base layer 934, the bond pads 936, 938, 940, 942, the semiconductor die 950, and open portions of the recessed region 910. The metallic layer can then be patterned and etched to form the first metallic connector 970 and the second metallic connector 972. The first metallic connector 970 can be coupled to the second bond pad 938 and the second metallic connector 972 can be coupled to the third bond pad 940. In illustrative examples, the first metallic connector 970 can form a tether between the second bond pad 938 and a bond pad on the semiconductor die 950 and the second metallic connector 972 can form a tether between the third bond pad 940 and an additional bond pad on the semiconductor die 950. The first metallic connector 970 and the second metallic connector 972 can comprise one or more metallic materials. To illustrate, the first metallic connector 970 and the second metallic connector 972 can comprise at least one of aluminum, an alloy of aluminum, copper, an alloy of copper, silver, an alloy of silver, gold, an alloy of gold, nickel, an alloy of nickel, titanium, an alloy of titanium, or one or more combinations thereof.

Figure 12:
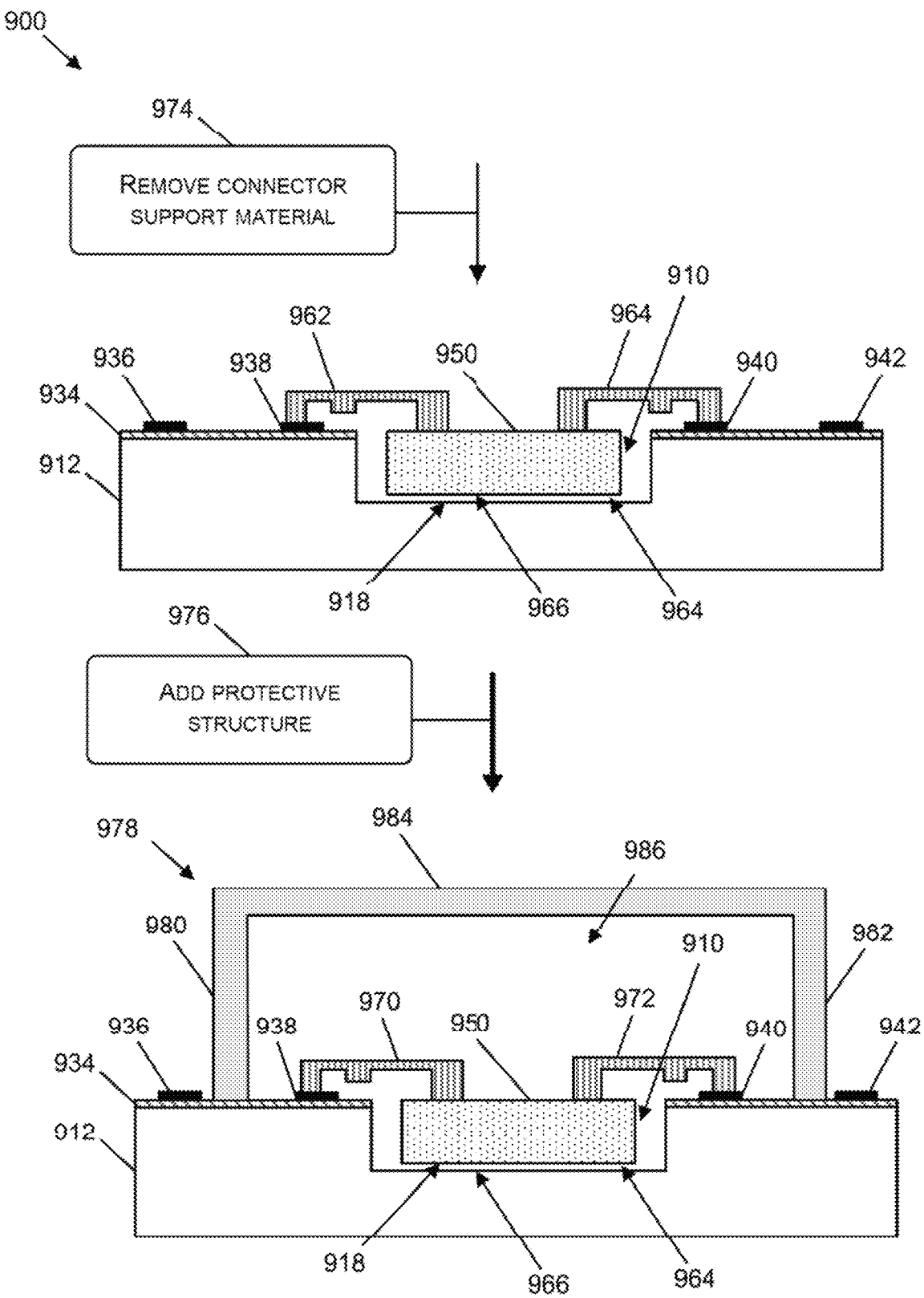
FIG. 12 is a diagram depicting fourth operations of a process to produce an integrated circuit package that includes a recessed region and a semiconductor die disposed within the recessed region.

FIG. 12 is a diagram depicting fourth operations of a process 900 to produce an integrated circuit package that includes a recessed region and a semiconductor die disposed within the recessed region. The process 900 includes, at operation 974, removing connector support material. For example, the first connector support 958 and the second connector support 960 can be removed. In illustrative examples, the first connector support 958 and the second connector support 960 can be removed using one or more chemical etching operations. After removing the first connector support 958 and the second connector support 960, the semiconductor die 950 can be suspended above the lower surface 918 by at least the first metallic connector 970 and the second metallic connector 972.

The first metallic connector 970 and the second metallic connector 972 can provide mechanical connections between the semiconductor die 950 and the base substrate 912, as well as electrical connections between electronic components of the semiconductor die 950 and electronic components coupled to the base substrate 912. In additional examples, the first metallic connector 970 and the second metallic connector 972 can provide mechanical connections between the semiconductor die 950 and the base substrate 912 and not electrical connections. Further, the first metallic connector 970 and the second metallic connector 972 can have mechanical properties that can limit the displacement of the semiconductor die 950 in response to movement of an integrated circuit package that includes the semiconductor die 950. For example, the first metallic connector 970 and the second metallic connector 972 can be comprised of one or more materials with mechanical spring characteristics that can enable some movement of the semiconductor die 950 in response to a force being applied to at least a portion of the semiconductor die 950 while limiting the displacement in a manner that minimizes the possibility of damage to electronic components of the semiconductor die 950.

In addition, the process 900 can include, at operation 976 adding a protective structure 978. The protective structure 978 can include a first side member 980 and a second side member 982. The first side member 980 and the second side member 982 can be disposed at least substantially parallel with respect to each other. The protective structure 978 can also include a top member 984 that is disposed at least substantially perpendicular with respect to the first side member 980 and the second side member 982. In illustrative examples, the first side member 980, the second side member 982, and the top member 984 can be a continuous piece of material.

The protective structure 978 can comprise a same material as the base substrate 912. For example, the protective structure 978 and the base substrate 912 can comprise silicon. In additional examples, the protective structure 978 can comprise at least one material that is different from one or more materials of the base substrate 912. To illustrate, the protective structure 978 can comprise a metallic material. The protective structure 978 can also comprise a polymeric material.

The protective structure 984 can form a cavity 986 in which at least the semiconductor die 950, the second bond pad 938, the first metallic connector 970, the third bond pad 940, and the second metallic connector 972 are located. In illustrative examples, the cavity 986 can be filled with one or more liquids, such as an oil. In additional examples, the cavity 986 can be filled with one or more gases. To illustrate, the cavity 986 can be filled with air. Further, the cavity 986 can be filled with a gas that has a greater density value than air at 20° C. and 1 atm, such as $SF_6$. The cavity 986 can also be filled with one or more solid materials. For example, the cavity 986 can be filled with a dielectric material. In various implementations, the cavity 986 can be filled with a gel.

The process 900 can be used to produce an integrated circuit package that contains the semiconductor die 950 and includes at least the base substrate 912, the first metallic connector 970, the second metallic connector 972, the bond pads 936, 938, 940, 942, and the protective structure 978. For example, the process 900 can be used to produce the integrated circuit package 300 described with respect to FIG. 3. The integrated circuit package produced using the process 900 can be coupled to a printed circuit board, in various implementations. Further, the integrated circuit package can be housed in an additional integrated circuit package.

Figure 13:
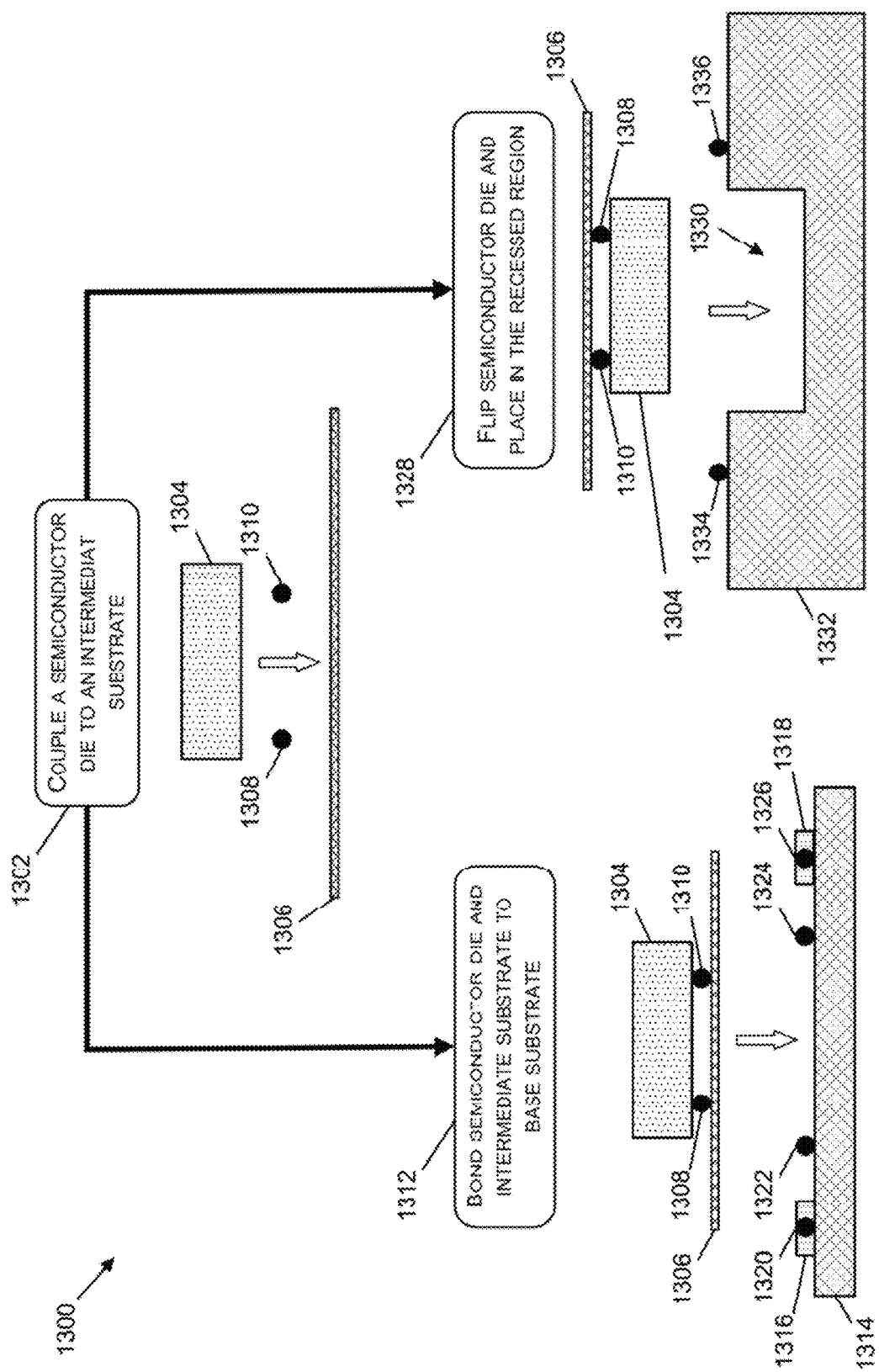
FIG. 13 is a diagram depicting a process to produce an integrated circuit package that includes a support substrate to couple a semiconductor die to a base substrate of the integrated circuit package.

FIG. 13 is a diagram depicting a process 1300 to produce an integrated circuit package that includes a support substrate to couple a semiconductor die to a base substrate of the integrated circuit package. The process 1300 can include, at operation 1302, coupling a semiconductor die 1304 to a support substrate 1306. The semiconductor die 1304 can be coupled to the support substrate 1306 using a thermosonic bonding process. The semiconductor die 1304 can comprise a silicon-containing material and can include circuitry for performing various operations. The support substrate 1306 can comprise a polymeric material. In illustrative examples, the support substrate 1306 can comprise a laminate material that includes a plurality of layers that individually include at least one of one or more polymeric materials, one or more metallic materials, or one or more glass materials.

The semiconductor die 1304 can be coupled to the support substrate 1306 using one or more bonding materials. In illustrative examples, the semiconductor die 1304 can be coupled to the carrier substrate 1306 using a number of metallic ball connectors including at least the first ball connector 1308 and the second ball connector 1310. Although not shown in the illustrative example of FIG. 13, the semiconductor die 1304 and the support substrate 1306 can include a number of metallic bond pads. The first ball connector 1308 and the second ball connector 1310 can be coupled to the semiconductor die 1304 and the support substrate 1306 via respective bond pads disposed on the semiconductor die 1304 and the support substrate 1306.

After the semiconductor die 1304 is coupled to the carrier substrate 1306, the process 1300 can proceed along one of two paths with each path being implemented to produce a different integrated circuit package. For example, the process 1300 can proceed to operation 1312 where the combination of the semiconductor die 1304 and the support substrate 1306 can be coupled to a base substrate 1314. In illustrative examples, the combination of the semiconductor die 1304 and the support substrate 1306 can be coupled to the base substrate 1314 using a thermosonic bonding process. The base substrate 1314 can comprise a polymeric material. In addition, the base substrate 1314 can comprise a laminate material having a plurality of layers that individually include at least one of one or more polymeric materials, one or more metallic materials, or one or more glass materials. In various examples, the support substrate 1306 and the base substrate 1314 can comprise a same material. Additionally, the base substrate 1314 can have a thickness that is greater than a thickness of the support substrate 1306.

The support substrate 1306 can be coupled to the base substrate 1314 using one or more bonding materials. To illustrate, the support substrate 1306 can be coupled to the base substrate 1314 with a first adhesive segment 1316 and a second adhesive segment 1318. The first adhesive segment 1316 and the second adhesive segment 1318 can comprise an adhesive material that has a modulus of elasticity of no greater than about 3 GPa. The support substrate 1306 can also be coupled to the base substrate 1314 using a number of additional metallic ball connectors. For example, the support substrate 1306 can be coupled to the base substrate 1314 using a third ball connector 1320, a fourth ball connector 1322, a fifth ball connector 1324, and a sixth ball connector 1326. In illustrative examples, the third ball connector 1320 can be encased in the first adhesive segment 1316 and the sixth ball connector 1326 can be encased in the second adhesive segment 1318.

Although not shown in the illustrative example of FIG. 13, the support substrate 1306 and the base substrate 1314 can include a number of metallic bond pads. The third ball connector 1320, the fourth ball connector 1322, the fifth ball connector 1324, and the sixth ball connector 1326 can be coupled to the support substrate 1306 and the base substrate 1314 via respective bond pads disposed on the support substrate 1306 and the base substrate 1314. In additional examples, the third ball connector 1320 and the sixth ball connector 1326 can be coupled to the support substrate 1306 and the base substrate 1314 using respective bond pads and the fourth ball connector 1322 and the fifth ball connector 1324 can be coupled between the support substrate 1306 and the base substrate 1314 without being bonded using bonding pads or solder bonding. In this way, the fourth ball connector 1322 and the fifth ball connector 1324 can be support bumps that are not bonded to the support substrate 1306 and/or the base substrate 1314 in the same manner as the third ball connector 1320 and the sixth ball connector 1326.

Further, the support substrate 1306, the base substrate 1314, and the adhesive segments 1316, 1318 can have physical properties that can limit the displacement of the semiconductor die 1304 in response to movement of an integrated circuit package that includes the semiconductor die 1304. For example, support substrate 1306 and the base substrate 1314 can comprise relatively flexible materials and have respective thicknesses that minimize the stress induced on the semiconductor die 1304 when force is applied to one or more portions of the semiconductor die 1304. Additionally, the adhesive material included in the adhesive segments 1316 and 1318 can have a modulus of elasticity that minimizes stress experienced by the semiconductor die 1304 when a force is applied to one or more portions of the semiconductor die 1304. The respective locations of the ball connectors 1308, 1310, 1320, 1322, 1324, 1326 can minimize stress experienced by the semiconductor die 1304 when a force is applied to one or more portions of the semiconductor die 1304.

Although not shown in the illustrative example of FIG. 13, a protective structure can be formed over the semiconductor die 1304, the support substrate 1306, and at least a portion of the base substrate 1314. In illustrative examples, the protective structure can comprise a metallic material. The branch of the process 1300 that includes operation 1312 can be used to produce an integrated circuit package that contains the semiconductor die 1304 and includes at least the support substrate 1306, the base substrate 1314, the ball connectors 1308, 1310, 1320, 1322, 1324, 1326, and the adhesive segments 1316, 1318. For example, the branch of the process 1300 that includes operation 1312 can be used to produce the integrated circuit package 600 described with respect to FIG. 6. The integrated circuit package can be coupled to a printed circuit board, in various implementations. Further, the integrated circuit package produced using the operations 1302 and 1312 can be housed in an additional integrated circuit package.

In additional implementations, the process 1300 can include an operation 1328 where the semiconductor die 1304 and the support substrate 1306 are flipped and at least a portion of the semiconductor die 1304 is disposed in a recessed region 1330 of a base substrate 1332. The base substrate 1332 can comprise a polymeric material. In addition, the base substrate 1332 can comprise a laminate material having a plurality of layers that individually include at least one of one or more polymeric materials, one or more metallic materials, or one or more glass materials. In various examples, the support substrate 1306 and the base substrate 1332 can comprise a same material. Additionally, the base substrate 1332 can have a thickness that is greater than a thickness of the support substrate 1306.

The support substrate 1306 can also be coupled to the base substrate 1332 using a number of additional metallic ball connectors. For example, the support substrate 1306 can be coupled to the base substrate 1332 using a seventh ball connector 1334 and an eighth ball connector 1336. In illustrative examples, the support substrate 1306 can be bonded to the base substrate 1332 using a thermosonic bonding process. Although not shown in the illustrative example of FIG. 13, the support substrate 1306 and the base substrate 1332 can include a number of metallic bond pads. The seventh ball connector 1334 and the eighth ball connector 1336 can be coupled to the support substrate 1306 and the base substrate 1332 via respective bond pads disposed on the support substrate 1306 and the base substrate 1332.

Further, the support substrate 1306 and the base substrate 1314 can have physical properties that can limit the displacement of the semiconductor die 1304 in response to movement of an integrated circuit package that includes the semiconductor die 1304. For example, support substrate 1306 and the base substrate 1332 can comprise relatively flexible materials and have respective thicknesses that minimize the stress induced on the semiconductor die 1304 when force is applied to one or more portions of the semiconductor die 1304. Additionally, the respective locations of the ball connectors 1308, 1310, 1334, 1336 can minimize stress experienced by the semiconductor die 1304 when a force is applied to one or more portions of the semiconductor die 1304.

Although not shown in the illustrative example of FIG. 13, a protective structure can be formed over the semiconductor die 1304, the support substrate 1306, and at least a portion of the base substrate 1332. In illustrative examples, the protective structure can comprise a metallic material. The branch of the process 1300 that includes operation 1328 can be used to produce an integrated circuit package that contains the semiconductor die 1304 and includes at least the support substrate 1306, the base substrate 1332, and the ball connectors 1308, 1310, 1334, 1336. For example, the branch of the process 1300 that includes operation 1328 can be used to produce the integrated circuit package 400 described with respect to FIG. 4. The integrated circuit package can be coupled to a printed circuit board, in various implementations. Further, the integrated circuit package produced using operations 1302 and 1328 can be housed in an additional integrated circuit package.

Figure 14:
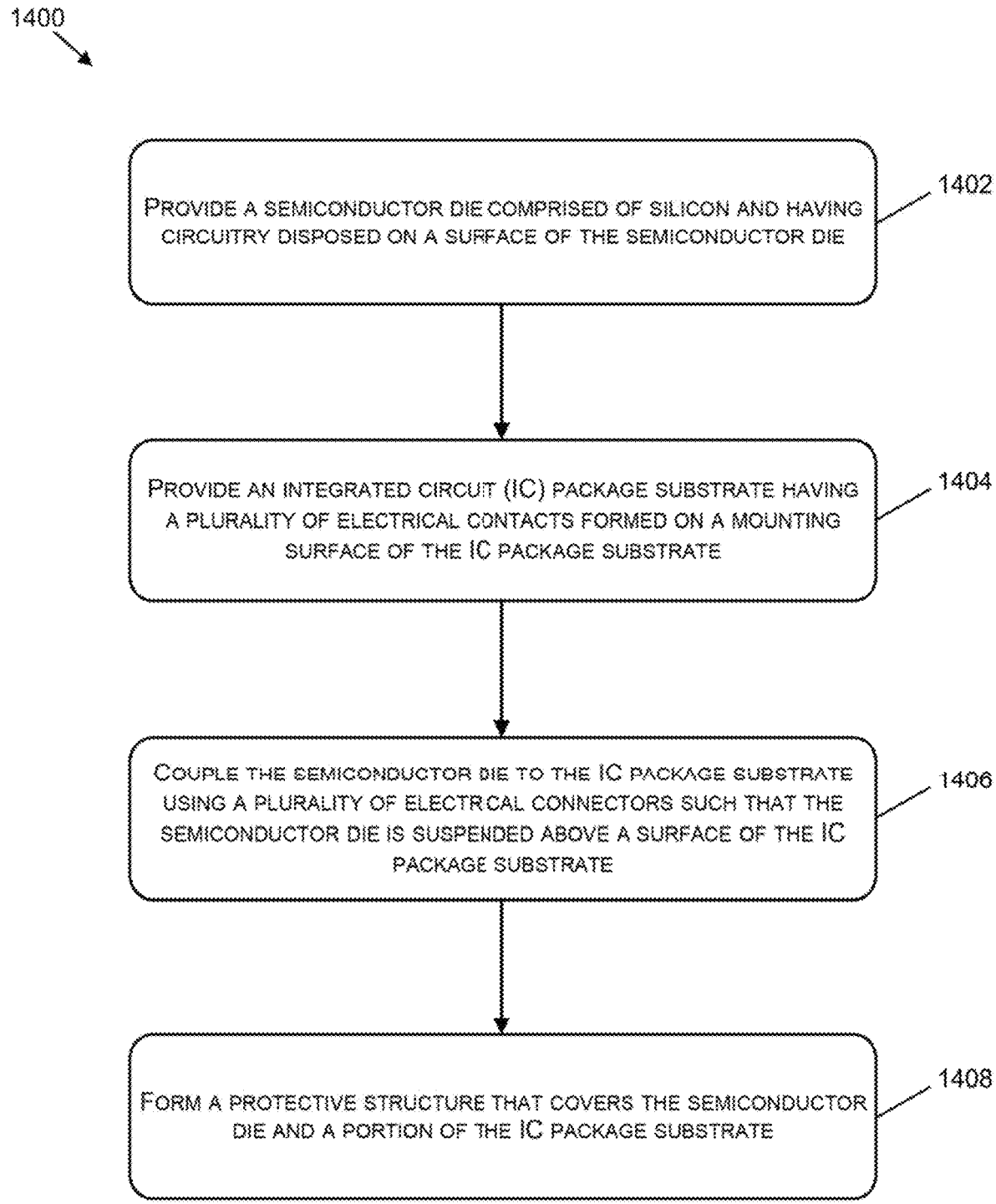
FIG. 14 is a flow diagram depicting operations of an example process to produce an integrated circuit package containing a semiconductor die that is suspended above a surface of the integrated circuit package.

FIG. 14 is a flow diagram depicting operations of an example process 1400 to produce an integrated circuit package containing a semiconductor die that is suspended above a surface of the integrated circuit package. The process 1400 can include, at operation 1402, providing a semiconductor die comprised of silicon and having circuitry disposed on a surface of the semiconductor die. The circuitry can include bandgap reference voltage circuitry. The circuitry can also include amplifier circuitry. In addition, the circuitry can include analog-to-digital converter circuitry.

The process 1400 can also include, at operation 1404, providing an integrated circuit (IC) package substrate having a plurality of electrical contacts formed on a mounting surface of the IC package substrate. The IC package substrate can comprise silicon. In additional examples, the IC package substrate can comprise a laminate material having a plurality of layers. Individual layers of the laminate material can include at least one of one or more polymeric materials, one or more metallic materials, or one or more ceramic materials. In illustrative examples, the IC package substrate can comprise an FR4 or an FR5 material.

Additionally, the process 1400 can include, at operation 1406, coupling the semiconductor die to the IC package substrate using a plurality of electrical connectors such that the semiconductor die is suspended above a surface of the IC package substrate. Individual electrical connectors of the plurality of electrical connectors can be coupled between respective electrical contacts on the mounting surface of the IC package substrate and corresponding electrical contacts on the semiconductor die. The plurality of electrical connectors can comprise metallic wires, in various implementations. In additional implementations, the plurality of electrical connectors can comprise metallic ball connectors. The plurality of electrical connectors can have physical properties, including shape, dimensions, and material composition, that can limit the displacement of the semiconductor die in response to movement of the integrated circuit package. The movement of the integrated circuit package can be caused by temperature changes and/or moisture level changes that the semiconductor die and the integrated circuit package are subjected to.

The semiconductor die can be suspended above the mounting surface of the IC package substrate, in various examples. Additionally, the IC package substrate can include a recessed region and the semiconductor die can be disposed at least partially within the recessed region. In implementations where the semiconductor die is disposed in the recessed region, the plurality of electrical connectors can comprise metallic tethers that suspend the semiconductor die above a surface within the recessed region. Further, the semiconductor die can be disposed within the recessed region using an intermediate, support substrate. The support substrate can be coupled to both the semiconductor die and the IC package substrate using metallic ball connectors. The support substrate can be longer than the semiconductor die such that the semiconductor die can be coupled to an interior portion of the support substrate and the IC package substrate can be coupled to a perimeter region of the support substrate.

At operation 1408, the process 1400 can include forming a protective structure that covers the semiconductor die and a portion of the IC package substrate. In implementations where the IC package substrate comprises silicon, the protective structure can also comprise silicon. Further, in implementations where the IC package substrate comprises a laminate material, the protective structure can comprise a metallic material. The protective structure can form a cavity around the semiconductor die. The cavity can be filled with a substance. In illustrative examples, the substance that fills the cavity can include at least one of a gas, a gel, a dielectric, or an oil. In various examples, the substance that fills the cavity can include air. Additionally, the substance that fills the cavity can include a gas that has a density value at 20° C. and 1 atm that is greater than a density value of air at 20° C. and 1 atm.

Figure 15:
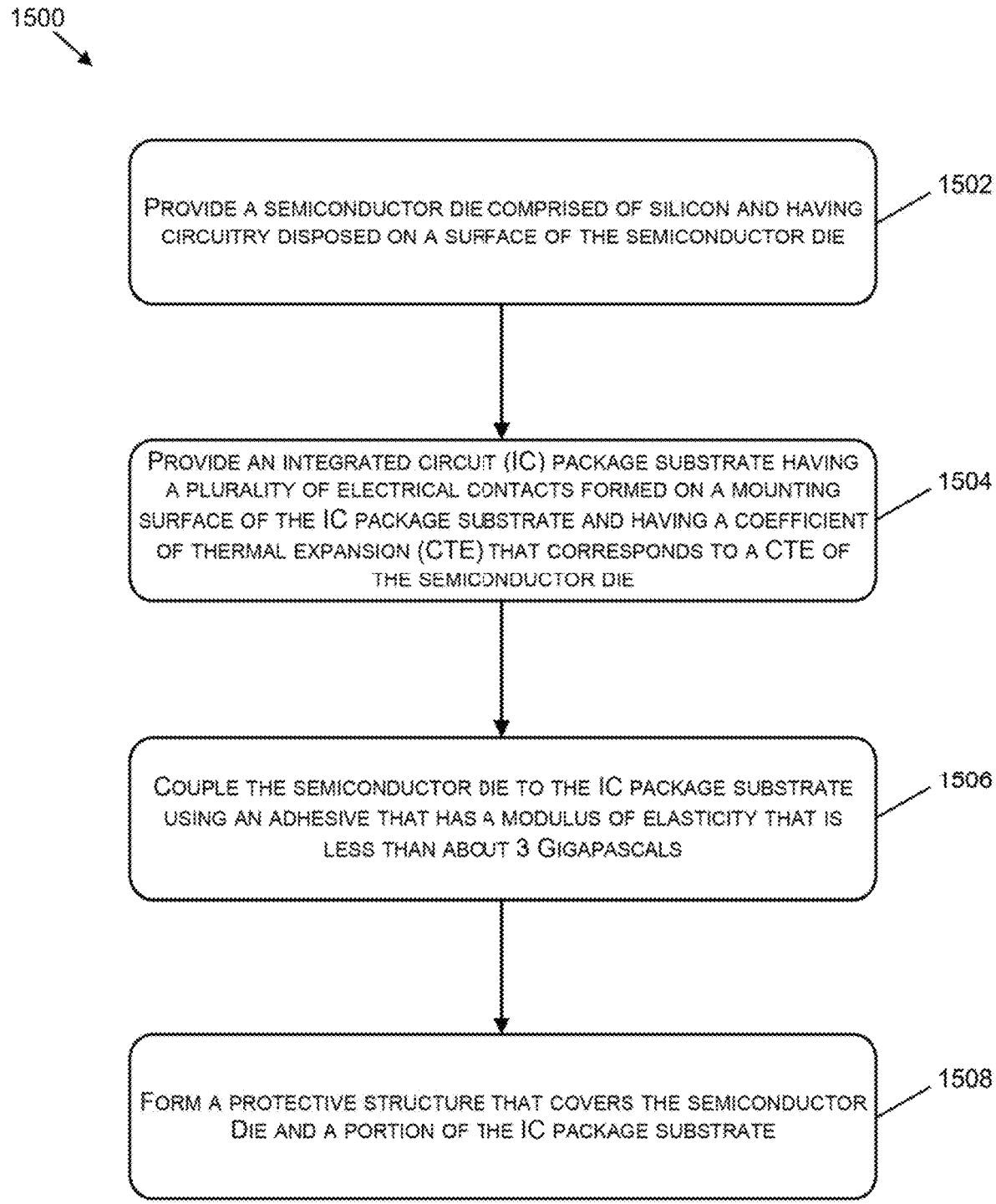
FIG. 15 is a flow diagram depicting operations of an example process to produce an integrated circuit package containing a semiconductor die that is coupled to a substrate having a relatively low coefficient of thermal expansion using an adhesive that has a relatively low modulus of elasticity.

FIG. 15 is a flow diagram depicting operations of an example process 1500 to produce an integrated circuit package containing a semiconductor die that is coupled to a substrate having a relatively low coefficient of thermal expansion using an adhesive that has a relatively low modulus of elasticity. The process 1500 can include, at operation 1502, providing a semiconductor die comprised of silicon and having circuitry disposed on a surface of the semiconductor die.

In addition, the process 1500 can include, at operation 1504, providing an integrated circuit (IC) package substrate having a plurality of electrical contacts formed on a mounting surface of the IC package substrate. The IC package substrate can also have a coefficient of thermal expansion that corresponds to the coefficient of thermal expansion of the semiconductor die. That is, the IC package substrate can have a coefficient of thermal expansion that corresponds to the coefficient of thermal expansion of silicon. In illustrative examples, the IC package substrate can have a coefficient of thermal expansion that is no greater than about 5 ppm/° C. Further, the IC package substrate can comprise a laminate material having a plurality of layers. Individual layers of the laminate material can include at least one of one or more polymeric materials, one or more metallic materials, or one or more ceramic materials. In illustrative examples, the IC package substrate can comprise an FR4 or an FR5 material.

The process 1500 can also include, at operation 1506, coupling the semiconductor die to the IC package substrate using an adhesive that has a modulus of elasticity that is less than about 3 GPa. In illustrative examples, an adhesive layer can be deposited on the IC package substrate and the semiconductor die can be bonded to the IC package substrate using the adhesive layer. In various examples, the adhesive layer can be disposed in one or more rows and/or one or more columns such that portions of the surface of the semiconductor die coupled to the IC support substrate are not covered by the adhesive layer. In additional examples, the adhesive layer can be disposed on the IC package substrate such that the adhesive layer is disposed around a perimeter region of the semiconductor die.

In further examples, an intermediate, support substrate can couple the semiconductor die to the IC package substrate. To illustrate, the semiconductor die can be thermosonically bonded to the support substrate using a number of metallic ball connectors. Subsequently, the combination of the semiconductor die and the support substrate can be thermosonically bonded to the IC package substrate using an additional number of metallic ball connectors. The combination of the support substrate and the semiconductor die can also be coupled to the IC package substrate using the adhesive that has the modulus of elasticity of no greater than about 3 GPa. The physical properties and dimensions of the support substrate, the IC package substrate, and the adhesive, as well as the locations of the metallic ball connectors can minimize the amount of stress placed on the semiconductor die in response to movement of the integrated circuit package.

At operation 1508, the process 1400 can include forming a protective structure that covers the semiconductor die and a portion of the IC package substrate. The protective structure can comprise a metallic material that is bonded to the IC package substrate. The protective structure can form a cavity around the semiconductor die. In implementations where a support substrate is used to couple the semiconductor die to the IC package substrate, the protective structure can also cover the support substrate. The cavity can be filled with a substance. In illustrative examples, the substance that fills the cavity can include at least one of a gas, a gel, a dielectric, or an oil. In various examples, the substance that fills the cavity can include air. Additionally, the substance that fills the cavity can include a gas that has a density value at 20° C. and 1 atm that is greater than a density value of air at 20° C. and 1 atm.

A numbered non-limiting list of aspects of the present subject matter is presented below.

Aspect 1. An integrated circuit (IC) package to carry a semiconductor IC die with reduced stress between the IC package and the semiconductor die, the IC package including: a base substrate having a mounting surface, the mounting surface including a plurality of electrical contacts; and a plurality of electrical connectors, arranged to couple respective first electrical contacts of the plurality of electrical contacts on the mounting surface with corresponding second electrical contacts on the semiconductor die; and wherein the IC die is suspended above a surface of the base substrate to form a suspension gap between a suspended surface of the IC die and the surface of the base substrate.

Aspect 2. The IC package of aspect 1, wherein: the second electrical contacts on the semiconductor die are disposed on a contacts surface of the semiconductor die, the contacts surface being at least substantially parallel with respect to the suspended surface; and the suspension gap is between the suspended surface of the IC die and the mounting surface of the base substrate.

Aspect 3. The IC package of aspect 1 or 2, further comprising a protective structure that extends from the mounting surface and covers the semiconductor die, wherein the protective structure contains silicon and the base substrate contains silicon.

Aspect 4. The IC package of aspect 3, wherein the protective structure forms a cavity around the semiconductor die and the plurality of electrical connectors, wherein the cavity is filled with a substance that includes an oil, a gel, a dielectric material, air, or a gas that has a density value at 20° C. and 1 atm that is greater than a density value of air at 20° C. and 1 atm.

Aspect 5. The IC package of any one of aspects 1-4, wherein the plurality of electrical connectors include at least 10 wires coupled between the respective first electrical contacts of the mounting surface and the corresponding second electrical contacts on the semiconductor die.

Aspect 6. The IC package of aspect 5, wherein the at least 10 wires are coupled to the second electrical contacts on the semiconductor die such that the semiconductor die moves no greater than about 1 micrometer when a force is applied to at least a portion of the semiconductor die, the force having a value from at least about 20,000 gravitational force equivalents to no greater than about 30,000 gravitational force equivalents.

Aspect 7. The IC circuit package of any one of aspects 1-6, comprising a plurality of additional connectors that couple the semiconductor die to the mounting surface such that the semiconductor die moves no greater than about 1 micrometer when a force is applied to at least a portion of the semiconductor die, the force having a value from at least about 20,000 gravitational force equivalents to no greater than about 30,000 gravitational force equivalents.

Aspect 8. The IC package of any one of aspects 1-7, comprising: a recessed region having: a recessed surface disposed below the mounting surface; and a sidewall surface disposed between the mounting surface and the recessed surface; and wherein: a gap region is formed between the sidewall surface of the recessed region and one or more side surfaces of the semiconductor die; the suspension gap is between the suspended surface of the semiconductor die and the recessed surface of the recessed region; and at least a portion of the semiconductor die is disposed within the recessed region.

Aspect 9. The IC package of aspect 8, wherein the plurality of electrical connectors include metallic strips that extend across the gap region and couple the semiconductor die to the mounting surface.

Aspect 10. The IC package of aspect 8, wherein the plurality of electrical connectors indirectly couple the respective first electrical contacts of the mounting surface to the corresponding second electrical contacts on the semiconductor die, and the IC package comprising: a support substrate that includes a group of third electrical contacts disposed along at least portion of a perimeter region of the support substrate and a group of fourth electrical contacts disposed in a region of the support substrate that is interior with respect to the perimeter region, wherein the plurality of electrical connectors couple the respective first electrical contacts of the mounting surface to the group of third electrical contacts; and a plurality of second additional electrical connectors that couple the group of fourth electrical contacts directly to the corresponding second electrical contacts on the semiconductor die.

Aspect 11. The IC package of aspect 10, further comprising a metallic protective structure that extends from the mounting surface and covers the IC die; and wherein: the support substrate contains a first polymeric material; the plurality of electrical connectors and the plurality of second additional electrical connectors include metallic balls; and the IC package substrate contains a second polymeric material.

Aspect 12. The IC package of aspect 11, wherein: the first polymeric material and the second polymeric material comprise a laminate material that includes a plurality of layers with individual layers of the plurality of layers including at least one of one or more polymeric materials, one or more metallic materials, or one or more glass materials; and the support substrate has a thickness that is less than a thickness of the IC package substrate.

Aspect 13. An integrated circuit (IC) package to carry a semiconductor die and reduce stress between the IC package and the semiconductor die, the IC package comprising: an adhesive layer coupling the semiconductor die to an IC package substrate, the adhesive layer having a modulus of elasticity of no greater than about 3 Gigapascals (GPa) and the IC package substrate comprising a polymeric material having a coefficient of thermal expansion of no greater than about 5 parts per million per° C.; and a metallic protective structure coupled to the IC package substrate, the metallic protective structure covering the semiconductor die and the adhesive layer.

Aspect 14. The IC package of aspect 13, comprising: a plurality of electrical connectors that include metallic wires; and wherein: the IC package substrate includes a mounting surface including a plurality of electrical contacts; and the plurality of electrical connectors couple respective first electrical contacts of the plurality of electrical contacts on the mounting surface with corresponding second electrical contacts on the semiconductor die.

Aspect 15. The IC package of aspect 13 or 14, comprising: a support substrate located between the IC package substrate and the semiconductor die, the support substrate containing an additional polymeric material; and wherein the adhesive layer is disposed between the support substrate and the IC package substrate.

Aspect 16. The IC package of aspect 15, wherein: the support substrate is coupled to the semiconductor die such that a first gap is present between the semiconductor die and the support substrate; the support substrate is coupled to the IC package substrate such that a second gap is present between the IC package substrate and the support substrate; and the adhesive layer includes a plurality of segments that are disposed in the second gap.

Aspect 17. The IC package of aspect 16, comprising: a first plurality of metallic ball connectors disposed between a surface of the semiconductor die and a first surface of the support substrate, the first surface of the support substrate facing the semiconductor die; and a second plurality of metallic ball connectors disposed between a second surface of the support substrate and a surface of the IC package substrate, the second surface of the support substrate being substantially parallel to the first surface of the support substrate and the second surface of the support substrate facing the IC package substrate.

Aspect 18. The IC package substrate of aspect 17, wherein: the adhesive layer is disposed around a perimeter region of the second surface of the support substrate; a first portion of the second plurality of metallic ball connectors are disposed within the adhesive layer and are coupled to respective electrical contacts on the support substrate; and a second portion of the second plurality of metallic ball connectors are disposed outside of the adhesive layer and within the second gap.

Aspect 19. An integrated circuit (IC) package to carry a semiconductor IC die with reduced stress between the IC package and the semiconductor die, the IC package including: an IC package substrate having a mounting surface, the mounting surface including a plurality of electrical contacts and the IC package substrate having a coefficient of thermal expansion no greater than about 5 parts per million per° C.; an intermediate spacing component coupled to the mounting surface and disposed between the IC package substrate and the semiconductor die, the intermediate spacing component having a width that is less than a width of the semiconductor die; and a plurality of wire connectors arranged to couple respective first electrical connectors of the plurality of electrical contacts on the mounting surface with corresponding second electrical contacts on the semiconductor die.

Aspect 20. The IC package of aspect 19, wherein the semiconductor die comprises silicon and the intermediate spacing component comprises silicon.

Aspect 21. The IC package of aspect 19 or 20, wherein the IC package substrate and the intermediate spacing component comprise a laminate material that includes a plurality of layers with individual layers of the plurality of layers including at least one of one or more polymeric materials, one or more metallic materials, or one or more glass materials.

Aspect 22. The IC package of any one of aspects 19-21, comprising a metallic protective structure that extends from the IC package substrate and covers the semiconductor die, the intermediate spacing component, and the plurality of wire connectors.

Aspect 23. An apparatus to reduce stress between an integrated circuit (IC) package and a semiconductor die included in the apparatus, the apparatus comprising: a printed circuit board coupled to the IC package, the IC package housing the IC die and the IC die including at least one of bandgap voltage reference circuitry, analog-to-digital converter circuitry, or amplifier circuitry; and wherein the IC package includes: an IC package substrate and a protective structure that form a cavity within the IC package, the semiconductor die being located within the cavity and the IC package substrate having a coefficient of thermal expansion of no greater than about 5 parts per million per° C.; and an adhesive layer coupling the IC die to the IC package substrate, the adhesive layer having a modulus of elasticity of no greater than about 3 gigapascals (GPa).

Aspect 24. The apparatus of aspect 23, wherein a substance fills the cavity, the substance including an oil, a gel, a dielectric material, air, or an additional gas, the additional gas having a density at 20° C. and 1 atmosphere (atm) that is at least two times a density of air at 20° C. and 1 atm.

Aspect 25. The apparatus of aspect 23 or 24, wherein the IC package substrate includes a flame retardant (FR) 4 material or a FR5 material.

Aspect 26. The apparatus of any one of aspects 23-25, wherein: the IC package substrate includes a plurality of first electrical contacts on a mounting surface of the IC package substrate and a plurality of second electrical contacts on the IC die; the IC package includes a plurality of wires, individual wires of the plurality of wires coupling individual first electrical contacts with individual second electrical contacts; and the protective structure is coupled to the mounting surface of the IC package substrate with an additional adhesive material.

Aspect 27. A process to produce an integrated circuit (IC) package that reduces stress between the IC package and a semiconductor die included in the IC package, the process comprising: providing an IC package substrate including a mounting surface having a plurality of first electrical contacts; providing the semiconductor die, the semiconductor die having a plurality of second electrical contacts disposed on a first surface of the semiconductor die; coupling the mounting surface of the IC package substrate to a second surface of the semiconductor die using an attachment material, the second surface of the semiconductor die facing the mounting surface; coupling a plurality of electrical connectors between respective first electrical contacts of the plurality of first electrical contacts on the mounting surface and corresponding second electrical contacts of the plurality of second electrical contacts on the semiconductor die; and removing the attachment material such that the IC die is suspended above the mounting surface to form a suspension gap between the second surface of the semiconductor die and the mounting surface.

Aspect 28. The process of aspect 27, comprising: forming a protective structure that extends from the mounting surface, the protective structure covering the semiconductor die and the plurality of electrical connectors.

Aspect 29. The process of aspect 27 or 28, wherein the IC package substrate contains silicon and the protective structure contains silicon.

Aspect 30. The process of any one of aspects 27-29, wherein the plurality of electrical connectors include metallic wires that are coupled to at least a portion of the plurality of second electrical contacts on the semiconductor die such that the semiconductor die moves no greater than about 1 micrometer when a force is applied to at least a portion of the semiconductor die, the force having a value from at least about 20,000 gravitational force equivalents to no greater than about 30,000 gravitational force equivalents.

Aspect 31. The process of any one of aspects 27-30, comprising coupling a plurality of additional connectors between the semiconductor die and the mounting surface of the package substrate, the plurality of additional connectors being coupled between the semiconductor die and the mounting surface of the package substrate such that the semiconductor die moves no greater than about 1 micrometer when a force is applied to at least a portion of the semiconductor die, the force having a value from at least about 20,000 gravitational force equivalents to no greater than about 30,000 gravitational force equivalents.

Aspect 32. A process to produce an integrated circuit (IC) package that reduces stress between the IC package and a semiconductor IC die included in the IC package, the process comprising: providing an IC package substrate, the IC package substrate having a mounting surface to couple the semiconductor die to the IC package substrate; forming a plurality of first electrical contacts on the mounting surface of the IC package substrate; forming a recessed region within the package substrate, the recessed region being located within an interior region of the mounting surface, the recessed region having a recessed surface below the mounting surface, and the recessed region having a sidewall surface disposed between the mounting surface and the recessed surface; placing the semiconductor die within the recessed region using a bonding material, the semiconductor die having a plurality of second electrical contacts located on a first surface of the semiconductor die and the semiconductor die being placed such that a gap region is present between the sidewall surface of the recessed region and the semiconductor die; placing a plurality of electrical connectors between respective first electrical contacts on the mounting surface of the IC package substrate and corresponding second electrical contacts on the first surface of the semiconductor die; and removing the attachment material such that a second surface of the semiconductor die is suspended above the recessed surface and a suspension gap is present between the second surface of the semiconductor die and the recessed surface, the second surface of the semiconductor die facing the recessed surface and being at least substantially parallel to the first surface of the semiconductor die.

Aspect 33. The process of aspect 32, comprising: depositing a layer of a photosensitive material upon at least a portion of the plurality of first electrical contacts and upon at least a portion of the semiconductor die such that the gap region is covered by the layer of the photosensitive material, the photosensitive material being configured to undergo a change in physical properties in response to exposure to a range of wavelengths of electromagnetic radiation; forming a patterned layer of the photosensitive material by exposing the layer of the photosensitive material to a pattern of electromagnetic radiation having wavelengths included in the range of wavelengths; depositing a metallic material onto the patterned layer of the photosensitive material; and removing the patterned layer of the photosensitive material to form the plurality of electrical connectors between the respective first electrical contacts of the mounting surface and the corresponding second electrical contacts on the semiconductor die.

Aspect 34. The process of aspect 32 or 33, comprising: performing a plasma etch operation to remove the patterned layer of the photosensitive material.

Aspect 35. The process of any one of aspects 32-34, wherein the plurality of electrical connectors include metallic strips.

Aspect 36. The process of any one of aspects 32-35, comprising: forming a protective structure that extends from the mounting surface and covers the semiconductor die, the plurality of first electrical contacts, and the plurality of electrical connectors.

Aspect 37. The process of aspect 36, comprising: forming a plurality of additional electrical contacts on the mounting surface of the IC package substrate, the plurality of additional electrical contacts being located in a perimeter region of the mounting surface and are not covered by the protective structure.

Aspect 38. A process to produce an integrated circuit (IC) package that reduces stress between the IC package and a semiconductor die included in the IC package, the process comprising: providing the semiconductor die, the semiconductor die having circuitry disposed on a first surface of the semiconductor die and having a second surface that is substantially parallel to the first surface; coupling the second surface of the semiconductor die to a support substrate using a plurality of first metallic ball connectors, the support substrate having a coefficient of thermal expansion that is no greater than about 5 parts per million (ppm)/° C. and comprising a laminate material having a plurality of layers with individual layers of the plurality of layers including at least one of one or more polymeric materials, one or more metallic materials, or one or more glass materials; and coupling the support substrate to a mounting surface of an IC package substrate using a plurality of second metallic ball connectors, the IC package substrate having a thickness that is greater than a thickness of the support substrate, a coefficient of thermal expansion that is no greater than about 5 ppm/° C., and comprising the laminate material.

Aspect 39. The process of aspect 38, wherein the support substrate is coupled to the semiconductor die using a first thermosonic bonding process and the support substrate is coupled to the IC package substrate using a second thermosonic bonding process.

Aspect 40. The process of aspect 38 or 39, comprising coupling the support substrate to the IC package substrate using an adhesive material that includes an epoxy and has a modulus of elasticity that is no greater than about 3 gigapascals (GPa); and wherein the support substrate is disposed between the semiconductor die and the IC package substrate.

Aspect 41. The process of any one of aspects 38-40, comprising: forming a recessed region in the IC package substrate, the recessed region having a sidewall surface and a recessed surface that is below the mounting surface; and placing at least a portion of the semiconductor die into the recessed region such that the first surface of the semiconductor die is suspended above the recessed surface.

Aspect 42. The process of aspect 41, comprising cutting a trench into a portion of the IC package substrate to form the recessed region.

Aspect 43. The process of any one of aspects 41 or 42, comprising: providing a substrate comprised of the laminate material, a first side component comprised of the laminate material, and a second side component comprised of the laminate material; and coupling the first side component and the second side component to the substrate to produce the IC package substrate having the recessed region, wherein the first side component and the second side component form the sidewall surface and an exposed portion of the substrate forms the recessed surface.

Each of the non-limiting aspects or examples described herein may stand on its own or may be combined in various permutations or combinations with one or more of the other examples.

The above detailed description includes references to the accompanying drawings, which form a part of the detailed description. The drawings show, by way of illustration, specific embodiments in which the invention may be practiced. These implementations are also referred to herein as "examples." Such examples may include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following claims are hereby incorporated into the Detailed Description as examples or implementations, with each claim standing on its own as a separate implementation, and it is contemplated that such implementations can be combined with each other in various combinations or permutations. The scope of the invention should be determined with reference to the appended claims, along with the full scope of equivalents to which such claims are entitled.

The invention claimed is:

1. An apparatus to reduce stress between an integrated circuit (IC) package and a semiconductor die included in the apparatus, the apparatus comprising:
   a printed circuit board coupled to the IC package, the IC package housing the semiconductor die; and
   wherein the IC package includes:
   an IC package substrate;
   a dielectric material or a polymeric material disposed on the semiconductor die; and
   an adhesive layer coupling the semiconductor die to the IC package substrate, the adhesive layer having a modulus of elasticity of no greater than about 3 gigapascals (GPa).

2. The apparatus of claim 1, wherein the semiconductor die includes at least one of bandgap voltage reference circuitry, analog-to-digital converter circuitry, or amplifier circuitry.

3. The apparatus of claim 1, wherein the IC package substrate has a coefficient of thermal expansion of no greater than about 5 parts per million per° C.

4. The apparatus of claim 1, wherein:
   the IC package includes a plurality of first electrical contacts on a mounting surface of the IC package substrate and a plurality of second electrical contacts on the semiconductor die; and
   the IC package includes a plurality of wires, individual wires of the plurality of wires coupling individual first electrical contacts with individual second electrical contacts.

5. The apparatus of claim 4, wherein the plurality of wires are comprised of at least one of copper, an alloy of copper, aluminum, an alloy of aluminum, gold, an alloy of gold, nickel, an alloy of nickel, titanium, an alloy of titanium, lead, an alloy of lead, tin, or an alloy of tin.

6. The apparatus of claim 1, wherein the adhesive layer includes an epoxy-containing adhesive.

7. The apparatus of claim 1, wherein the adhesive layer includes a boron nitride-containing adhesive.

8. The apparatus of claim 1, wherein the adhesive layer has a modulus of elasticity from about 0.5 GPa to about 2 GPa.

9. The apparatus of claim 1, wherein the adhesive layer is disposed on the IC package substrate in a plurality of segments and one or more gaps are present between the plurality of segments of the adhesive layer.

10. The apparatus of claim 1, wherein a thickness of the IC package substrate is from about 100 micrometers to about 800 micrometers.

11. The apparatus of claim 1, wherein the IC package substrate is comprised of a laminate material with a plurality of layers that are individually comprised of at least one of a polymeric material, a metallic material, or a glass material.

12. The apparatus of claim 1, wherein the IC package substrate is comprised of a polyimide.

13. The apparatus of claim 1, wherein the IC package substrate is comprised of an FR4 material or an FR5 material.

14. The apparatus of claim 1, comprising:
   a protective structure that forms a cavity within the IC package and the semiconductor die is located within the cavity.

15. The apparatus of claim 14, wherein the protective structure includes:
   a first side member;
   a second side member at least substantially parallel with respect to the first side member; and
   a top member that is disposed at least substantially perpendicular with respect to the first side member and the second side member.

16. The apparatus of claim 15, wherein the first side member, the second side member, and the top member are formed from a continuous piece of material.

17. The apparatus of claim 14, wherein the protective structure is comprised of a metallic material.

18. The apparatus of claim 14, wherein the protective structure is coupled to the IC package substrate by one or more adhesives.

19. The apparatus of claim 14, wherein the protective structure is coupled to the IC package substrate by one or more metallic materials.

20. The apparatus of claim 14, wherein a gas is disposed within the cavity.

* * * * *